(12) United States Patent
Okamoto et al.

(10) Patent No.: US 6,214,108 B1
(45) Date of Patent: Apr. 10, 2001

(54) METHOD OF MANUFACTURING SILICON CARBIDE SINGLE CRYSTAL AND SILICON CARBIDE SINGLE CRYSTAL MANUFACTURED BY THE SAME

(75) Inventors: Atsuto Okamoto; Naohiro Sugiyama; Toshihiko Tani; Nobuo Kamiya; Hiroaki Wakayama; Yoshiaki Fukushima, all of Aichi-ken; Kazukuni Hara, Kariya; Fusao Hirose, Kariya; Shoichi Onda, Kariya; Kunihiko Hara, Kariya; Takashi Onoda, Kariya; Haruyoshi Kuriyama, Kariya; Takeshi Hasegawa, Kariya, all of (JP)

(73) Assignees: Kabushiki Kaisha Toyota Chuo Kenkyusho, Aichi-gun; Denso Corporation, Kariya, both of (JP)

( * ) Notice: Subject to any disclaimer, the term of this patent is extended or adjusted under 35 U.S.C. 154(b) by 0 days.

(21) Appl. No.: 09/318,646

(22) Filed: May 26, 1999

(30) Foreign Application Priority Data

| May 19, 1998 | (JP) | 10-149912 |
| Jul. 17, 1998 | (JP) | 10-203696 |
| Jul. 17, 1998 | (JP) | 10-203697 |
| Jul. 21, 1998 | (JP) | 10-221099 |

(51) Int. Cl.$^7$ .................................................. C30B 25/02
(52) U.S. Cl. ............................. 117/95; 117/88; 427/255
(58) Field of Search ..................... 117/88, 95; 427/248.1, 427/255

(56) References Cited

U.S. PATENT DOCUMENTS

| 5,679,153 | * | 10/1997 | Dmitriev et al. | 117/106 |
| 5,958,132 | * | 9/1999 | Takahashi et al. | 117/84 |

FOREIGN PATENT DOCUMENTS

| 5-26599 | 2/1993 | (JP) . |
| 5-262599 | 10/1993 | (JP) . |
| 9-157092 | 6/1997 | (JP) . |
| 9-268096 | 10/1997 | (JP) . |
| 10-324600 | 12/1998 | (JP) . |
| WO 99/00538 | 1/1999 | (WO) . |

OTHER PUBLICATIONS

R. Yakimova et al., "Silicon Carbide Liquid Phase Eptiaxy In The Si–Sc–C System," Inst. Phys. Conf., Ser. No. 142: Chapter 1, pp. 101–104.

* cited by examiner

*Primary Examiner*—Felisa Hiteshew
(74) *Attorney, Agent, or Firm*—Oblon, Spivak, McClelland, Maier & Neustadt, P.C.

(57) ABSTRACT

Micropipe defects existing in a silicon carbide single crystal are closed within the single crystal. At least a portion of the micropipe defects opened on the surface of the silicon carbide single crystal (SiC substrate) is sealed up with a coating material. Then heat treatment is performed so as to saturate the inside of the micropipe defects with silicon carbide vapors. By this, the micropipe defects existing in the SiC substrate can be closed within the SiC substrate, not in a newly grown layer. Further, the micropipe defects can be efficiently closed by filling the micropipe defects with a silicon carbide material by preliminarily using super critical fluid and the like.

31 Claims, 10 Drawing Sheets

Fig. 11

| Experimental examples No | SiC substrate polytype | thickness | orientation | MPD | Coating material kind | polytype | orientation | structure | thickness | seal |
|---|---|---|---|---|---|---|---|---|---|---|
| 1 | 6H | 300μm | (0001) | ~50cm$^{-2}$ | epitaxil film | 3C | (111) | single crystal | ~20μm | ○ |
| 2 | 6H | 300μm | (0001) | ~50cm$^{-2}$ | epitaxil film | 3C | (111) | single crystal | ~20μm | ○ |
| 3 | 6H | 300μm | (0001) | ~50cm$^{-2}$ | epitaxil film | 3C | (111) | single crystal | ~20μm | ○ |
| 4 | 6H | 300μm | (0001) | ~50cm$^{-2}$ | epitaxil film | 3C | (111) | single crystal | ~5μm | × |
| 5 | 6H | 300μm | (0001) | ~50cm$^{-2}$ | epitaxil film | 3C | | poly crystal | ~20μm | ○ |
| 6 | 6H | 900μm | (0001) | ~40cm$^{-2}$ | epitaxil film | 3C | (111) | single crystal | ~20μm | ○ |
| 7 | 6H | 300μm | (0001) | ~50cm$^{-2}$ | epitaxil film | 3C | (111) | single crystal | ~2μm | × |
| 8 | 6H | 300μm | (0001) | ~50cm$^{-2}$ | substrate | 3C | | poly crystal | ~300μm | △ |
| 9 | 6H | 250μm | (0001) | ~40cm$^{-2}$ | substrate | 6H | (0001) | single crystal | ~300μm | △ |
| 10 | 4H | 300μm | (0001) | ~40cm$^{-2}$ | epitaxil film | 6H | (0001) | single crystal | ~10μm | ○ |
| 11 | 4H | 300μm | (0001)off- | ~40cm$^{-2}$ | epitaxil film | 3C | (111)off- | single crystal | ~10μm | ○ |
| 12 | 6H | 200μm | (0001) | ~40cm$^{-2}$ | Tangsten film | | | poly crystal | ~10μm | ○ |
| | 4H | 300μm | (0001) | ~40cm$^{-2}$ | epitaxil film | 3C | (111) | single crystal | ~10μm | ○ |
| | 4H | 300μm | (0001) | ~40cm$^{-2}$ | epitaxil film | 3C | (111) | single crystal | ~10μm | ○ |
| | 4H | 300μm | (0001) | ~40cm$^{-2}$ | epitaxil film | 3C | (111) | single crystal | ~10μm | ○ |
| 13 | 6H | 900μm | (0001) | ~40cm$^{-2}$ | none | | | | | × |
| 14 | 6H | 300μm | (0001) | ~50cm$^{-2}$ | epitaxil film | 3C | (111) | single crystal | ~4μm | ○ |
| 15 | 6H | 500μm | (0001) | ~50cm$^{-2}$ | epitaxil film | 3C | (111) | single crystal | ~10μm | ○ |
| 16 | 6H | 300μm | (0001) | ~40cm$^{-2}$ | epitaxil film | 3C | (111) | single crystal | ~4/12μm | ○ |
| 17 | 6H | 700μm | (0001) | ~50cm$^{-2}$ | | | | amorphous | ~5μm | × |
| 18 | 6H | 700μm | (0001) | ~40cm$^{-2}$ | none | | | | | × |
| 19 | 6H | 300μm | (0001) | ~40cm$^{-2}$ | epitaxil film | 3C | (111) | single crystal | ~20μm | ○ |
| 20 | 6H | 300μm | (0001) | ~30cm$^{-2}$ | graphite plate | | | poly crystal | ~800μm | △ |
| 21 | 6H | 300μm | (0001) | ~30cm$^{-2}$ | graphite+SiC | | | poly crystal | ~800μm | △ |
| 22 | 6H | 300μm | (0001) | ~30cm$^{-2}$ | graphite+SiC | 3C | (111) | poly crystal | ~1.0μm | △ |
| 23 | 4H | 300μm | (0001) | ~50cm$^{-2}$ | substrate | 3C | | poly crystal | ~300μm | △ |
| 24 | 4H | 300μm | (0001) | ~40cm$^{-2}$ | none | | | | | × |
| 25 | 4H | 300μm | (0001) | ~40cm$^{-2}$ | epitaxil film | 3C | (111) | single crystal | ~20μm | ○ |
| 26 | 6H | 500μm | (0001) | ~30cm$^{-2}$ | epitaxil film | 3C | (111) | single crystal | ~20μm | ○ |
| 27 | 6H | 300μm | (0001) | ~40cm$^{-2}$ | epitaxil film | 3C | (111) | single crystal | ~10/20μm | ○ |
| C.1 | 6H | 900μm | (0001) | ~40cm$^{-2}$ | none | | | | | × |
| C.2 | 6H | 900μm | (0001) | ~40cm$^{-2}$ | none | | | | | × |
| C.3 | 6H | 300μm | (0001) | ~50cm$^{-2}$ | epitaxil film | 3C | (111) | poly crystal | ~5μm | × |

Fig. 12

| Experimental examples NO | Surface protecting material kind | structure | thickness | Ts | To | ΔT | pressure | hour |
|---|---|---|---|---|---|---|---|---|
| 1 | none | | | 2200°C | 2200°C | 0°C | $6.7×10^4$Pa | 6 |
| 2 | none | | | 2200°C | 2300°C | 100°C | $1.3×10^2$Pa | 6 |
| 3 | none | | | 2200°C | 2320°C | 120°C | $1.3×10^2$Pa | 6 |
| 4 | none | | | 2200°C | 2300°C | 100°C | $1.3×10^2$Pa | 6 |
| 5 | none | | | 2200°C | 2300°C | 100°C | $1.3×10^2$Pa | 6 |
| 6 | none | | | ~2260°C | ~2300°C | ~40°C | $1.3×10^2$Pa | 26 |
| 7 | none | | | 2200°C | 2320°C | 120°C | $1.3×10^2$Pa | 6 |
| 8 | none | | | 2230°C | 2250°C | 20°C | $1.3×10^2$Pa | 12 |
| 9 | none | | | 2230°C | 2250°C | 20°C | $6.7×10^4$Pa | 12 |
| 10 | none | | | ~2260°C | ~2300°C | ~40°C | $1.3×10^2$Pa | 26 |
| 11 | Tantalum film | poly crystal | ~10μm | ~2260°C | ~2300°C | ~40°C | $1.3×10^2$Pa | 26 |
| 12 | Graphite plate | poly crystal | ~800μm | ~2260°C | ~2300°C | ~40°C | $1.3×10^2$Pa | 26 |
| 13 | 3C | poly crystal | ~500μm | ~2260°C | ~2300°C | ~40°C | $1.3×10^2$Pa | 26 |
| 14 | none | | | ~2260°C | ~2300°C | ~40°C | $1.3×10^2$Pa | 26 |
| 15 | none | | | ~2260°C | ~2300°C | ~40°C | $1.3×10^2$Pa | 26 |
| 16 | none | | | 2200°C | 2300°C | 100°C | $1.3×10^2$Pa | 6 |
| 17 | none | | | 2230°C | 2250°C | 20°C | $6.7×10^4$Pa | 12 |
| 18 | none | | | 2200°C | 2200°C | 0°C | $2.0×10^8$Pa | 6 |
| 19 | none | | | ~2220°C | ~2250°C | ~30°C | $1.3×10^2$Pa | 24 |
| 20 | none | | | 2230°C | 2290°C | 60°C | $1.3×10^2$Pa | 6 |
| 21 | none | | | 2230°C | 2950°C | 65°C | $1.3×10^2$Pa | 24 |
| 22 | none | | | ~2260°C | ~2300°C | ~40°C | $1.3×10^2$Pa | 26 |
| 23 | none | | | 2230°C | 2295°C | 65°C | $1.3×10^2$Pa | 24 |
| 24 | none | | | 2230°C | 2295°C | 65°C | $1.3×10^2$Pa | 24 |
| 25 | none | | | 2230°C | 2295°C | 65°C | $1.3×10^2$Pa | 24 |
| 26 | none | | | 2230°C | 2250°C | 20°C | $1.3×10^2$Pa | 12 |
| 27 | none | | | 2200°C | 2300°C | 100°C | $6.7×10^4$Pa | 26 |
| C.1 | none | | | ~2255°C | ~2300°C | ~45°C | $1.3×10^2$Pa | 26 |
| C.2 | none | | | 2230°C | 2220°C | -10°C | $6.7×10^4$Pa | 12 |
| C.3 | none | | | 2200°C | 2265°C | 65°C | $1.3×10^2$Pa | 6 |
| C.4 | none | | | 2600°C | 2600°C | 0°C | $6.7×10^4$Pa | 6 |
| C.5 | none | | | 2200°C | 2300°C | 100°C | $1.3×10^2$Pa | 6 |

Fig. 13

| Experimental examples NO | Evalution closing rate | average closing length | closing length | closing length rate |
|---|---|---|---|---|
| 1 | 70% | ~100μm | | ~33% |
| 2 | 70% | ~120μm | | ~40% |
| 3 | 75% | ~120μm | | ~40% |
| 4 | 50% | ~60μm | | ~20% |
| 5 | 70% | ~100μm | | ~33% |
| 6 | 100% | ~210μm | | ~70% |
| 7 | 40% | ~90μm | | ~10% |
| 8 | 80% | ~100μm | | ~33% |
| 9 | 50% | ~80μm | | ~27% |
| 10 | 100% | ~170μm | | ~68% |
| 11 | 80% | ~120μm | | ~40% |
| 12 | 80% | ~120μm | | ~40% |
| 13 | 70% | ~100μm | | ~50% |
| 14 | 80% | ~120μm | | ~40% |
| 15 | 100% | ~180μm | | ~60% |
| 16 | 90% | ~150μm | | ~50% |
| 17 | 95% | ~160μm | | ~53% |
| 18 | 30% | ~45μm | | ~5% |
| 19 | 100% | ~140μm | | ~47% |
| 20 | 100% | ~220μm | | ~44% |
| 21 | 100% | ~180μm | | ~60% |
| 22 | 70% | ~100μm | | ~14% |
| 23 | 80% | ~130μm | | ~19% |
| 24 | 100% | ~450μm | | ~64% |
| 25 | 90% | ~170μm | | ~57% |
| 26 | 100% | ~180μm | | ~60% |
| 27 | 100% | ~180μm | | ~60% |
| 28 | 50-80% | ~130μm | | ~43% |
| 29 | 100% | ~150μm | | ~50% |
| 30 | 100% | ~210μm | | ~70% |
| 31 | 100% | ~130μm | | ~43% |
| 32 | 100% | ~250μm | | ~50% |
| C.1 | 75% | ~10μm | | ~1% |
| C.2 | a few % | ~0μm | | ~0% |
| C.3 | 30% | ~40μm | | ~13% |

METHOD OF MANUFACTURING SILICON CARBIDE SINGLE CRYSTAL AND SILICON CARBIDE SINGLE CRYSTAL MANUFACTURED BY THE SAME

BACKGROUND OF THE INVENTION

1. Field of the Invention

The present invention relates to a method of manufacturing silicon carbide (SiC) single crystals in which micropipe defects are closed and silicon carbide single crystals with closed micropipe defects manufactured by the method.

2. Description of the Related Art

When an SiC single crystal is produced by the modified Lely method (sublimation method) using an SiC single crystal as a seed crystal, hollow tubes called micropipe defects with a diameter ranging from sub-microns ($\mu$m) to several microns ($\mu$m) are extended approximately along the growth direction, and contained in a grown crystal. An SiC single crystal having micropipe defects is not suitable as a substrate for electronic device formation since the micropipe defect significantly degrades the electric property of the device. Therefore, reduction of the micropipe defects is an important task for producing the SiC single crystal.

The methods for reducing the micropipe defects have been proposed in U.S. Pat. No. 5,679,153 and laid-open Japanese Patent Publication No. 5-262599(Japanese Patent No. 2804860).

In the method disclosed in U.S. Pat. No. 5,679,153, an epitaxial layer having reduced micropipe defects (defect density: 0 to 50 cm$^{-2}$) is allowed to grow on a SiC substrate having micropipe defects (defect density: 50 to 400 cm$^{-2}$) utilizing a phenomenon that micropipe defects are closed in the epitaxial layer on the SiC substrate by a liquid phase epitaxy from a melt of SiC in silicon.

In the method described in laid-open Japanese Patent Publication No. 5-262599(Japanese Patent No. 2804860), a single crystal revealing no hexagonal etch pit at all in alkali etching, that is, a single crystal having no micropipe defect is grown on the seed crystal by using a plane vertical to (0001) plane as a growing plane of the seed crystal.

In any of the above-described two methods, the single crystal is newly grown on the seed crystal and micropipe defects in the growing layer are reduced.

In the former method, an epitaxial layer having a thickness of 20 to 75 $\mu$m has to be grown by the liquid phase epitaxy technique for obtaining portions containing no micropipe defects, and micropipe defects are still existing below in this thickness range. Further, if the single crystal is grown again by a sublimation method using the above-formed epitaxial layer as a seed crystal, there is a possibility that sublimation from the closed portions of micropipe defects generates micropipe defect openings again since the closed portions of micropipe defects are thin. Therefore it is difficult to prepare a seed crystal and to suitably regulate sublimation growing condition to present in the closed portions from sublimating.

Meanwhile, although the latter method is effective for inhibiting the micropipe defect generation, stacking faults are newly generated in the grown single crystal. The substrates with stacking faults are known to exhibit an anisotropy of electron transport. Therefore, the crystal is not suitable for the substrate for the electronic device.

SUMMARY OF THE INVENTION

The present invention has been made in view of the foregoing problems, and an object thereof is not to suppress generation and succession of micropipe defects in a newly grown layer but to make it possible to close the micropipe defects existing in a silicon carbide single crystal within the crystal.

In order to accomplish the above-described object, in the present invention, at least a portion of a surface of a silicon carbide single crystal is coated with a coating material to seal up the micropipe defects openings, then, the single crystal is subjected to heat treatment to close micropipe defects existing in the silicon carbide single crystal.

Thus, micropipe defects existing in a silicon carbide single crystal can be closed by coating at least a portion of the surface of the silicon carbide single crystal with a coating material, then, performing heat treatment thereon. By this process, micropipe defects existing in silicon carbide single crystal can be closed within the silicon carbide single crystal, not in a newly grown layer on the silicon carbide single crystal. The silicon carbide single crystal includes a single crystal substrate, a single crystal ingot or the like.

Besides, when the heat treatment is performed such that the inside of the micropipe defects is saturated with silicon carbide vapors, the micropipe defects can be closed. In particular, micropipe defects existing in a silicon carbide single crystal can be closed by forming on at least a portion of a surface thereof, a silicon carbide, preferably, a silicon carbide single crystal or a silicon carbide oriented in the same direction as that of the crystal axis of the silicon carbide single crystal, a 3C-SiC (hereinafter, the Arabic numerals mean repetition period of a pair of Si-C in <0001> axis direction, C means a cubic system, H means a hexagonal system, R means a rhombohedral system.) epitaxial film, or the same/different polytype silicon carbide epitaxial film, then, performing heat treatment thereon.

Thus, crystal of the formed layer acts as a template during depositing in tubular voids so that micropipe defects can be closed more efficiently by forming the silicon carbide single crystal, the oriented silicon carbide and 3C-SiC epitaxial film.

As another feature of the present invention, a surface protecting material which protects a surface of a coating material is succeedingly provided on the coating material, then the heat treatment is performed. During the heat treatment, the coating material is protected from thermal etching by the surface protecting material, so that the coating material is prevented from being removed by sublimation and closed voids can be formed with certainly. As a result, the thickness of the coating material does not change compared to that before the heat treatment so that removing amount can be easily recognized when removing the coating material after forming closed voids.

Moreover, the heat treatment can be performed after providing the surface protecting material on the coating material, and then, fixing the silicon carbide single crystal on a seat to be installed in a crucible in which a silicon carbide source material is accommodated. As a result, the supply of the silicon carbide vapors to the coating material is performed in a preferable ambience so that thermal etching of the coating material is restricted more effectively. There is a possibility that the coating material sublimates if a several $\mu$m opening exists between the surface protecting material and the coating material. On the other hand, sublimating of the coating material is restricted even if the opening exists, when the heat treatment is performed under a saturated vapor pressure of silicon carbide vapors.

Furthermore, the surface protecting material can be made of a substance exhibiting a high melting point, a carbon material, i.e. a silicon carbide substrate or a silicon carbide powder. The substance exhibiting a high melting point, such as tungsten or tantalum, the carbon material and the silicon carbide are desirable because they are stable in the heat treatment.

On the other hand, micropipe defects can be closed more efficiently by previously filling the micropipe defects with a silicon carbide material, utilizing supercritical fluid and the like before the heat treatment. The micropipe defects can be closed further efficiently by coating the surface of a silicon carbide single crystal subsequent to filling the micropipe defects with the silicon carbide material.

The coating material can be formed of, for example, silicon carbide substrates or silicon carbide powders, 3C-SiC, silicon carbide single/poly-crystals having the same/different polytype as that of the silicon carbide single crystal, amorphous silicon carbides, materials exhibiting a high melting point (for example, tungsten), carbon materials (for example, graphite), or composite materials of a material containing silicon and the carbon material or the like.

Furthermore, it is desirable that the lattice orientation of the coating material of these single/poly-crystals is coincident with the orientation of the crystal axis of the silicon carbide single crystal having micropipe defects.

The present invention is further characterized by including a step for etching the surface of a silicon carbide single crystal, and a step for coating the surface of the single crystal thereafter. When the surface of the silicon carbide single crystal is etched, crystal strain around openings of the micropipe defects is relieved, enhancing the effect of closing micropipe defects.

It is necessary that openings of micropipe defects in a silicon carbide single crystal are completely sealed up due to the above-described coating step.

Further, silicon carbide single crystal substrates containing micropipe defects can be laminated, or the silicon carbide single crystal substrates can be laminated via a coating material, before concurrent heat treatment. This method is suitable for concurrently obtaining a plurality of silicon carbide single crystal substrates having substantially no micropipe defects at a reasonable cost since the micropipe defects in the respective silicon carbide single crystal substrate are concurrently obstructed.

Further, in the heat treatment step, by repeating a step for raising the temperature of the silicon carbide single crystal and a step for lowering the raised temperature thereof can be repeated. In this case, the silicon carbide in closed voids of the micropipe defects can be sublimated again by an amount corresponding to vapor pressure difference due to temperature difference caused by re-increase of the temperature and it can be re-deposited by an amount corresponding to vapor pressure difference due to temperature difference caused by re-decrease of the temperature. Accordingly, micropipe defects can be closed more efficiently.

Moreover, the inside of the micropipe defects can be saturated with silicon carbide vapors by accommodating a silicon carbide single crystal in a crucible with a silicon carbide source material and supplying the sublimated silicon carbide vapor species from the source material into the micropipe defects under the optimum condition of the heat treatment.

As another feature of the present invention, a silicon carbide single crystal is fixed on a seat of a lid to be installed in a crucible containing a silicon carbide source material, then, the silicon carbide source material is sublimated by heat treatment. At the same time, the sublimated silicon carbide vapors are supplied to form a coating material made of silicon carbide on the surface of the silicon carbide single crystal. The heat treatment is further continued to close micropipe defects existing in the silicon carbide single crystal within the crystal.

Thus, micropipe defects existing in a silicon carbide single crystal can also be closed within the crystal by accommodating the silicon carbide single crystal in a crucible for growing a silicon carbide single crystal by the sublimation method, forming a coating material on the silicon carbide single crystal therein, and further continuing heat treatment.

Furthermore, another feature of the present invention is that heat treatment is performed by keeping inert gas ambience in a vessel and introducing a nitrogen gas thereinto.

When a crystal grown by introducing the nitrogen gas in this way, a heterolytic interface can be formed between a coating material doped with nitrogen and a substrate crystal, so that the micropipe defects existing in silicon carbide single crystals can be closed efficiently.

Another feature of the present invention is that beat treatment is performed such that the temperature difference $\Delta T(=\text{To}-\text{Ts})$ ranges from $-200°$ C. to $200°$ C., where the temperatures of the silicon carbide source material and silicon carbide single crystal are To (° C.) and Ts (° C.), respectively.

Heat treatment is usually performed at $\Delta T \geq 0$. But when heat treatment is performed at $\Delta T<0$, re-crystallization between the silicon carbide single crystal and a seat of a lid or generation of crevasse-like defects due to the re-crystallization can be prevented.

As another method for preventing the above-described re-crystallization and crevasse-like defects, heat treatment is performed by reducing the temperature difference $\Delta T$ between the silicon carbide material and a silicon carbide single crystal (for example, $|\Delta T| \leq 10°$ C.) and raising the pressure of treating ambience ($\approx 1.0 \times 10^5$ Pa).

A silicon carbide single crystal formed by the above-described method is suitably used as a wafer for electronic devices, or used as a seed crystal for forming a new silicon carbide single crystal having no micropipe defects since micropipe defects of this single crystal are closed.

The silicon carbide single crystal produced by the above-described method is useful as a seed crystal, further as a wafer for electronic devices, since this single crystal has substantially no micropipe defects.

A silicon carbide single crystal having closed voids in which the micropipe defects are at least partially closed is useful since silicon carbide single crystal substrates having no micropipe defects can be taken out from portions having micropipe defects closed. A silicon carbide single crystal having both ends of micropipe defects closed is more advantageous in reducing the cost since the silicon carbide single crystal substrates having no micropipe defects can be taken out from both ends thereof.

In order to use a silicon carbide single crystal as a seed crystal through the sublimation technique, it is necessary to polish the crystal by an amount of about 50 μm or more, desirably about 75 μm or more per one surface in the polish and removal step to remove a damaged layer due to polish. Further, during the sublimation growth, the surface of the seed crystal may be thermally etched depending on the condition. As described above, when preparing a seed crystal from a silicon carbide single crystal having closed voids in which the length of closed portion is 75 μm or less, openings are possibly generated by polishing and thermal etching during the growth of a single crystal.

Therefore, when the silicon carbide single crystal having closed voids in which the length of closed portion is greater than 75 $\mu$m is used, there is no fear of generating such openings by polishing and thermal etching.

BRIEF DESCRIPTION OF THE DRAWINGS

FIG. 11 is a table of the result of evaluation indices for the closing phenomena introduced to quantify the blow-mentioned results.

FIG. 12 is a table of the result of evaluation indices for the closing phenomena introduced to quantify the blow-mentioned results.

FIG. 13 is a table of the result of evaluation indices for the closing phenomena introduced to quantify the blow-mentioned results.

DETAILED DESCRIPTION OF THE PRESENTLY PREFERRED EXEMPLARY EMBODIMENTS

Figure 1:
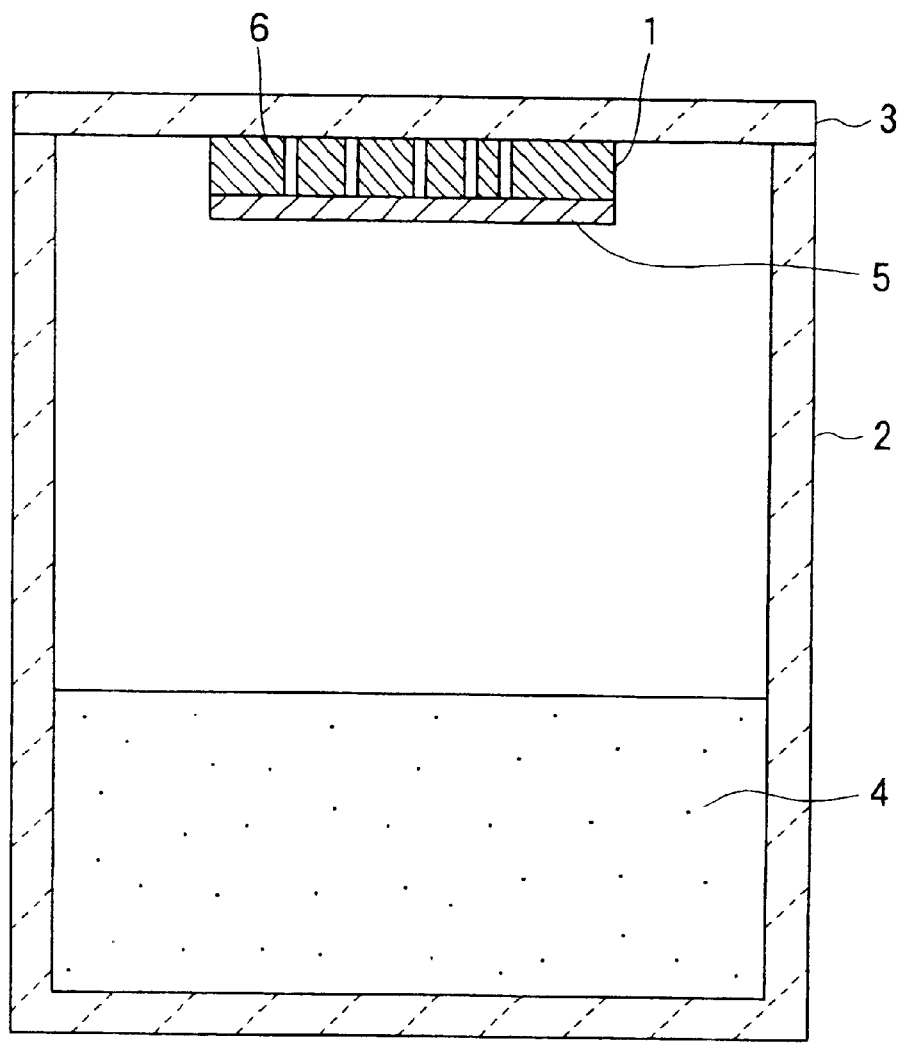
FIG. 1 is a sectional view of a heat treatment apparatus used for producing a silicon carbide single crystal in an embodiment of the present invention.

Embodiments shown in the drawings will be described herein.

(First Embodiment)

FIG. 1 shows a schematic sectional view of a heat treatment apparatus used for closing micropipe defects in an SiC substrate 1 (silicon carbide single crystal).

This heat treatment apparatus is composed of a crucible 2 having an open upper end and a lid 3 covering the open end of the crucible 2. The crucible 2 and the lid 3 are generally formed of graphite.

The crucible 2 accommodates a silicon carbide source material 4 used for conducting heat treatment to close micropipe defects in a stable manner with excellent reproducibility. The SiC substrate 1 is supported onto the lid 3 so as to face the silicon carbide source material 4 when the opening end of the crucible 2 is covered with the lid 3. Hereinafter, the supported surface of the SiC substrate 1 is called as a mount surface and the opposite surface to the mount surface is called as a non-mount surface.

Though not shown in FIG. 1, a resistively heated exothermic body made of graphite is provided around the outer surface of the crucible 2, which makes it possible to control the temperature in the crucible 2, particularly, the temperature of the SiC substrate 1 and the temperature of the silicon carbide source material 4. Further, though not shown in FIG. 1, the crucible 2 is accommodated in a vessel which can control the ambience pressure, thus allowing the introduction of an inert gas and the like into the crucible 2 and control of the ambience pressure.

Further, as shown in FIG. 1, the non-mount surface side of the SiC substrate 1 is coated with a coating material 5. This coating material can be deposited on the SiC substrate 1 by, for example, a gas phase growing method such as a chemical vapor deposition (CVD) method, molecular beam epitaxy (MBE) method, sputtering vapor deposition method, sublimation method and the like, or liquid phase growing method such as a liquid phase epitaxy (LPE) method and the like.

The coating material 5 can be composed of any of SiC having the same crystal structure as that of the SiC substrate 1 and SiC having different crystal form from that of the SiC substrate 1. When the material of the SiC substrate 1 belongs to a hexagonal system, a silicon carbide of a cubic system is suitable for the coating material.

In addition to an SiC single crystal, as the coating material, an SiC polycrystal, SiC sintered bodies, an amorphous SiC, carbon materials (for example, graphite, carbon nanotube, fullerenes and the like), composite materials of those containing silicon and carbon materials, and substances exhibiting a high melting point (for example, tungsten, tungsten carbide, boron nitride and the like) can be used.

In case that the orientation of above coating material of single crystal or polycrystal is coincident with the crystal axis of the SiC substrate, there is a high probability that micropipe defects are obstructed.

When the coating material 5 is formed of a cubic system silicon carbide (3C-SiC), the following method can be used as well as the above-described deposition method in which an organosilicon polymer, for example, polymethylcarbosilane, polycarbosilane and the like dissolved in an organic solvent is applied uniformly to the SiC substrate 1, the organic solvent is dried, then, the polymer is thermally decomposed in vacuum or in a non-oxidizing ambience such as Ar, $N_2$ and the like at a temperature from 600 to 1500° C. to coat the SiC substrate 1 with 3C-SiC.

In FIG. 1, the non-mount side surface of the SiC substrate 1 is coated with the coating material 5, however, at least one of both surfaces of the SiC substrate 1 may be coated with the coating material 5 and the non-mount side surface is not necessarily required to be coated. Further, the coating material 5 may be formed on the SiC substrate 1 prior to heat treatment described below, and also it may be formed on the surface of the SiC substrate 1 during heat treatment.

The thickness of this coating material 5 can be selected in the range from several tens of nanometers (nm) to several millimeters (mm), preferably it is selected in the range from several microns ($\mu$m) to several hundred microns ($\mu$m), in view of degree of freedom of heat treatment conditions and the production cost for closing the micropipe defects.

The thickness of the SiC substrate 1 can be selected arbitrarily, and it is desirably at least 100 μm or greater on the ground of the fact that as the SiC substrate 1 becomes thicker, a larger amount of substrates having no micropipe defects can be formed at one time. If the SiC substrate 1 becomes too thin, there is possibility of deformation and breakage, thus interrupting the smooth production process.

The thus structured SiC substrate 1 is placed in the heat treatment apparatus as shown in FIG. 1, then, heat treatment is performed.

Under this constitution, when the temperatures of the silicon carbide source material 4 and the SiC substrate 1 are respectively To (° C.) and Ts (° C.), and the temperature difference and the distance between the silicon carbide source material 4 and the substrate crystal 1 are $\Delta T$ (=To–Ts) and L (cm) respectively, then the temperature difference $\Delta T$ can be selected in the range from –200 to 200° C., the temperature gradient ($\Delta T/L$) can be selected in the range from –100 to 100° C./cm, and the temperature Ts of the substrate crystal 1 can be selected in the range from 1800 to 2500° C. as temperature conditions for heat treatment.

It is also permissible that the temperature Ts of the SiC substrate 1 is raised to a given temperature, then, the temperature is lowered with the lapse of time, and further a heat cycle may be repeated such that the temperature of the SiC substrate 1 is lowered after the temperature raise, then, the temperature is raised again.

By repeating the heat cycle, micropipe defects 6 can be closed efficiently by vapors which are generated when temperature is raised and re-deposited when temperature is lowered. Furthermore, the surface protecting material can be made of a substance exhibiting a high melting point, a carbon material, i.e. a silicon carbide substrate or a silicon carbide powder. The substance exhibiting a high melting point, such as tungsten or tantalum, the carbon material and the silicon carbide are desirable because they are stable in the heat treatment.

Figure 10:
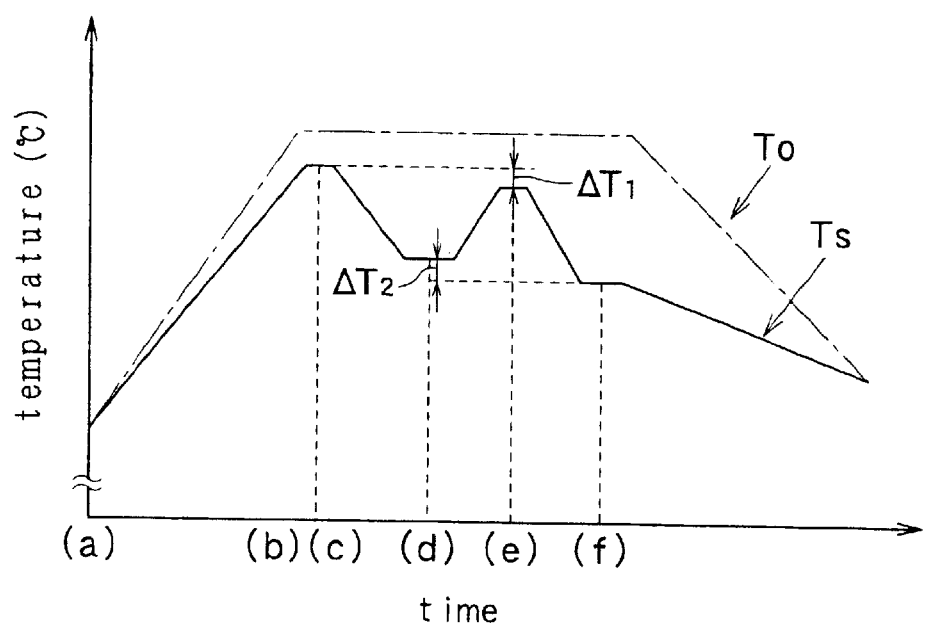
FIG. 10 is a view showing a profile of heat treatment with a heat cycle.

Providing that the temperatures of the silicon carbide source material 4 and the SiC substrate 1 are respectively To (° C.) and Ts (° C.), these temperatures are changed as shown in the heat treatment temperature profile of FIG. 10.

Particularly, the temperature To of the silicon carbide source material is raised to the sublimate temperature of a silicon carbide or higher and maintained in a given period, and then, lowered with the lapse of time.

The temperature Ts of the SiC substrate 1 is raised to a relatively high temperature (for example, 1800–2500° C.) and lowered to a relatively low temperature, thereafter, changed by repeating the temperature raising and lowering. Namely, the temperature Ts of the SiC substrate 1 is changed high and low by repeating a heat cycle comprising a temperature raising step and a temperature lowering step. In FIG. 10, although the temperature raising and lowering are repeated twice, it can be repeated more than that. Further, a period in which the temperature is fixed can be provided during the temperature shifting from high to low and from low to high, so that it is unnecessary that the temperature raising and lowering are performed at all times. Further, a temperature in a temperature raising step or in a temperature lowering step does not need to be equal to the corresponding temperature in another temperature raising step or in another temperature lowering step. For example, as shown by the arrows ($\Delta T1$, $\Delta T2$) in FIG. 10, the temperature can be lowered step by step. Further, although the number of the heat cycle can be determined appropriately according to a temperature of Ts and a velocity of the temperature raising and lowering, it is desirably repeated more than twice considering the manufacturing cost. Moreover, total time for the heat treatment is desirably between 3 and 48 hours.

The vapor pressure can be selected in the range from $1 \times 10^{-8}$ to $1 \times 10^9$ Pa.

Figure 2:
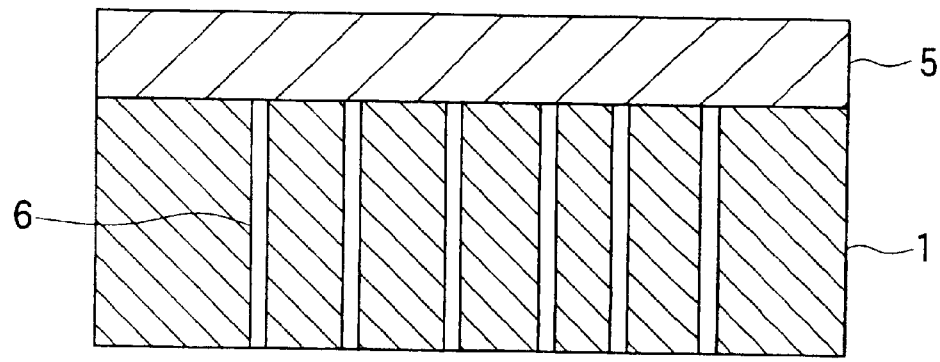
FIG. 2 is a view showing a silicon carbide single crystal having a surface coated with a coating material in a first embodiment of the present invention.
Figure 3:
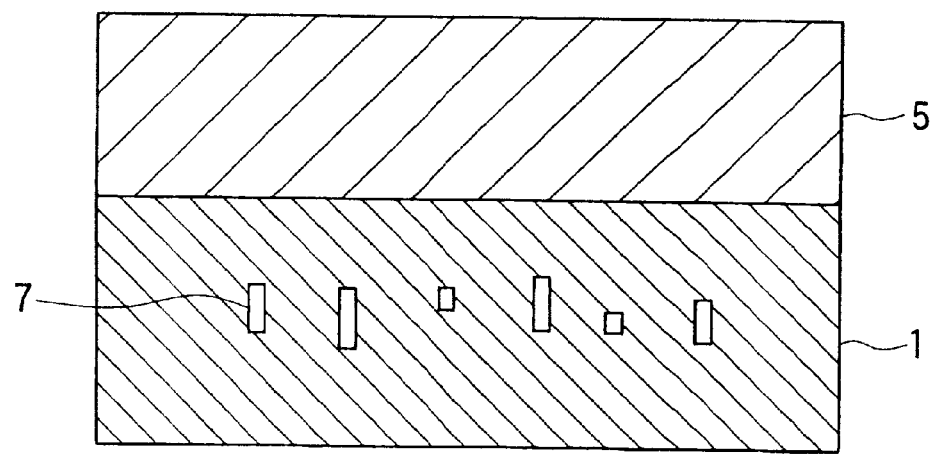
FIG. 3 is a view showing the silicon carbide single crystal after heat treatment in the first embodiment of the present invention.

The SiC substrate 1 before and after the above-described heat treatment are shown in FIG. 2 and FIG. 3, respectively. As shown in these figures, the micropipe defects 6 having openings on the surface of the SiC substrate are closed at least from one surface of the SiC substrate 1. In this constitution, the length of the closed portion of the micropipe defects 6 can be made greater than 75 μm from the surface of the SiC substrate 1. In this figure, closed voids 7 remain, however, it is possible that the micropipe defects 6 are substantially diminished in length depending on the heat treatment conditions (for example, increase in heat treatment time and the like), since the closed voids 7 are gradually closed corresponding to the heat treatment time and the number of repetition of raising and lowering temperature.

Thus, micropipe defects 6 in the SiC substrate 1 can be closed by heat treatment that satisfies the above-described temperature conditions and ambience pressure condition.

The mechanism by which the micropipe defects 6 are thus closed can be assumed as follows.

It is believed that a screw dislocation core having a large Burgers vector deforms into a hollow core which is the micropipe defect, to relieve the large elastic strain energy thereof (see F. C. Frank. Acta. Cryst. 4(1951) 497).

It is assumed that the reverse phenomenon to the above-described mechanism occurs in the closing phenomenon of micropipe defects 6. Estimated closing model of the micropipe defects 6 will be described in reference to FIGS. 4A through 4D.

Figure 4A:
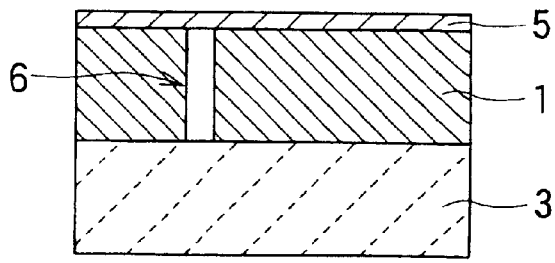
FIGS. 4A through 4D are views illustrating a mechanism for closing micropipe defects in the first embodiment of the present invention.
Figure 4B:
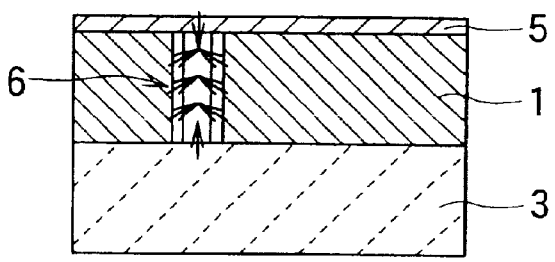

As shown in FIG. 4A, it is assumed that a SiC substrate 1, which contains micropipe defects 6 and on which a 3C-SiC epitaxial film is formed, is placed on a lid 3 made of graphite. In this structure, when this system is placed in the heat treatment apparatus as shown in FIG. 1 and heat treatment is performed under suitable temperature and pressure conditions. Then, as shown in FIG. 4B, vapors of Si, $SiC_2$, $Si_2C$ and the like are sublimated as shown by arrows in the figure from around the micropipe defects 6 and from the 3C-SiC film and the graphite lid, for maintaining balanced vapor pressure at the temperature.

Figure 4C:
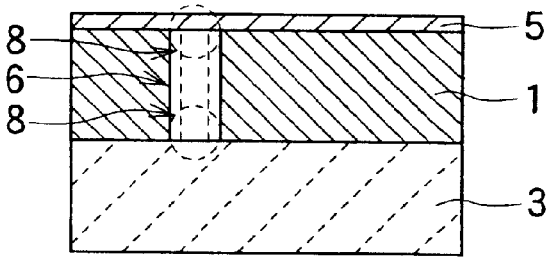
Figure 4D:
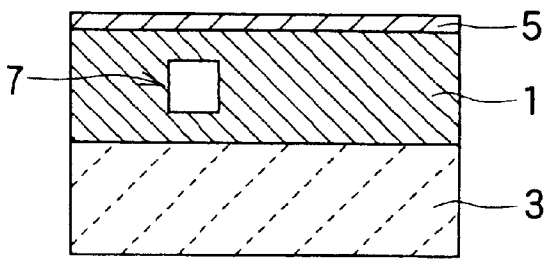

Then, it is estimated from the observation results by a transmission electron microscopy that at the interface with the graphite lid 3 and at the interface with the coating material, the micropipe defect, that is, a screw dislocation having a large Burgers vector, (Super Screw Dislocation) is decomposed to be an aggregate body (containing stacking faults, edge dislocations) of several screw dislocations having a Burgers vector of equal to or less than 1c (c corresponds to c axis length of unit lattice, e.g. c=1.5 nm for 6H-SiC), and micropipe defects are shortened by the movement of the constituent atoms to the sites in hollow cores, though the reason for this has not been clarified yet. However, it is assumed that the movement of the constituent atoms, or like that is occurred at the sites because it is energetically more favorable to form the crystalline material at the sites, as compared with to maintain the inner surface of the hollow core. Indeed, it is possible that the movement reduces the surface energy and the generated strain energy at the sites can be dispersed instead around the site during the heat treatment. Incidentally the movement of the constituent atoms, or like that would be made by the sublimation and/or diffusion phenomena, as shown in FIG. 4C and 4D.

It is estimated that a series of the process for coating with the coating material 5 at least one surface of an SiC substrate 1 having the micropipe defects 6 in one embodiment of the present invention (including also the case of simply mounting it onto the graphite lid 2) and then conducting heat treatment may serve to decompose the large Burgers vector of the micropipe defects 6 into multiple screw dislocations with a Burgers vector of equal to or less than 1c. As a result, the micropipe defects 6 can be closed.

By cutting out from the thus obtained SiC substrate 1 with a region not containing the micropipe defects 6 (for example, a substrate parallel to (0001) plane (on-axis substrate) or a substrate inclined at a given angle from the (0001) plane (off-axis)), there can be obtained an SiC substrate 1 substantially no micropipe defects 6. If the thus obtained SiC substrate 1 is subjected to the processing treatment and chemical cleaning treatment before application to a device manufacturing, there can be produced a high performance device exhibiting low energy-loss, high frequency, high speed and environmental-resistance. Further, it can also be supplied as a seed crystal in a crystal growth technique. Further, micropipe defects once closed are stable in view of energy, therefore, even if a silicon carbide single crystal 1 having micropipe defects closed is used as the seed crystal for the growth of a single crystal and a silicon carbide single crystal is allowed to grow thereon by a sublimation method, micropipe defects will not be generated again. Therefore, a large number of SiC substrates (for example, wafers for electronic devices) having no micropipe defects can be cut out from a single crystal ingot with high quality and long height, grown by using a silicon carbide single crystal having closed micropipe defects as a seed crystal.

Further, since micropipe defects can be closed in the SiC substrate 1, much labor is hardly required for a large number of growing experiments for enlarging the diameter of the substrate, while maintaining high quality, thus the production cost will be reduced to the greatest degree.

The crystal structure of the SiC substrate 1 may be 6H polytype, 4H polytype, or any other polytype.

As the SiC substrate 1, not only a substrate parallel to the (0001) plane (on-axis substrate) but also, for example, a substrate inclined at a given angle from the plane (off-axis substrate) may be used for providing the same effect.

Further, in examples described below, a SiC substrate 1 having a thickness of 1 mm or less is exemplified for illustration, however, a substrate having a thickness equal to or greater than 1 mm can also be used. Particularly, when the present invention is applied to a single crystal ingot, a large number of single crystal substrates having no micropipe defects at all are obtained at a time, therefore, such application is effective for the industrial process.

In the embodiment of the present invention, the heat treating apparatus for closing micropipe defects is described. The SiC substrate 1 is placed in the upper part of the crucible 2 wherein the lid 3 is positioned, and the silicon carbide source material 4 is placed in the lower portion as shown in FIG. 1, however, the present invention can also be applied to other apparatus, for example, an apparatus in which a silicon carbide source material 4 is placed in the upper portion of the crucible 2 and the SiC substrate 1 is placed in the lower portion. Though the vertical type heat treatment apparatus has been described above, a horizontal type heat treatment apparatus can also be used in the present invention. Alternatively, a well-known heating method using of induction as the related art can also be used as the heating method, providing the same effects.

Figure 8:
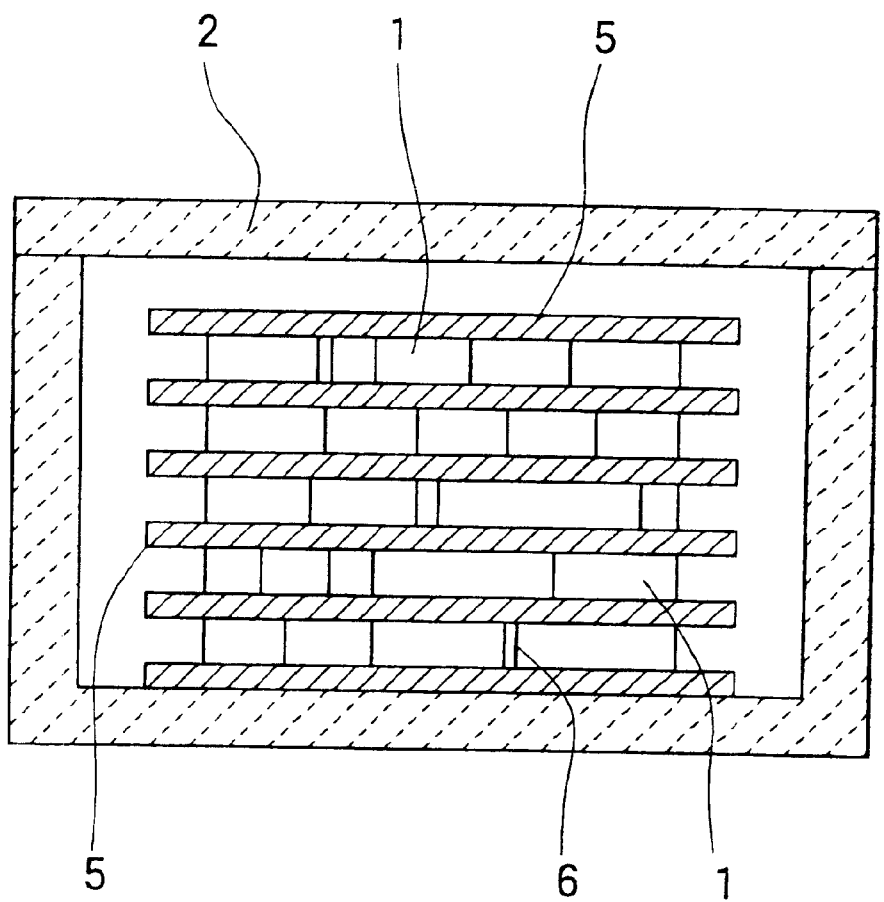
FIG. 8 is a sectional view of a heat treatment apparatus showing the case in which SiC substrates of the present invention are laminated before conducting heat treatment.

Further, as shown in FIG. 8, it is also possible that a plurality of SiC substrates 1 having micropipe defects 6 are laminated via coating materials 5, the coating materials 5 are further placed on the top and bottom surfaces of this laminate, which are heated simultaneously in the crucible 2. By the aforementioned process, a plurality of SiC substrates 1 can be simultaneously heat treated and the micropipe defects 6 can be efficiently closed.

Figure 9:
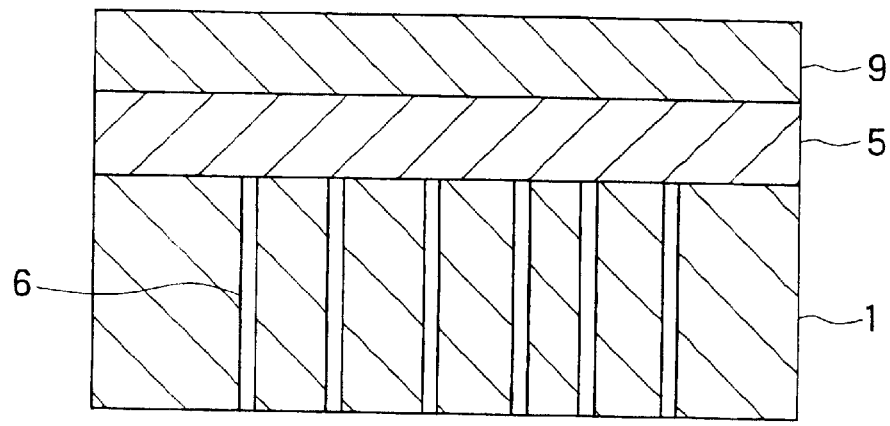
FIG. 9 is a view showing a silicon carbide single crystal having a surface provided with a surface protecting material on a coating material.

As a variation of the first embodiment, as shown in FIG. 9, the SiC substrate 1 can be placed in a crucible 2 with the condition that a carbon plate 9 as a surface protecting material put on a coating material 5.

As a result, a surface of the coating material 5 can be prevented from thermal etching by the carbon plate 9 during the heat treatment so that the thickness of the coating material 5 does not change compared to that before the heat treatment. Accordingly, closed voids 7 can be prevented from being opened again when the coating material 5 is removed by polishing and the like after forming closed voids 7 because removing amount can be recognized.

During the heat treatment, the coating material 5 is protected from thermal etching by the carbon plate 9, so that the coating material 5 is prevented from removing by sublimation and closed voids can be formed with certainly.

In case of that the heat treatment is performed with a silicon carbide source material 4 placed in the crucible 2, inside of a vessel can be filled up with a saturated vapor pressure ambience of silicon carbide vapors. As a result, it is prevented that the coating material 5 is sublimated through a small opening between the carbon plate 9 and the coating material 5 (in case of a surface of the coating material 5 and the like having several $\mu$m roughness), so that the thickness of the coating material 5 is prevented from changing before and after the heat treatment.

Furthermore, the surface protecting material can be made of a substance exhibiting a high melting point, a carbon material, i.e. a silicon carbide substrate or a silicon carbide powder. The substance exhibiting a high melting point, such as tungsten or tantalum, the carbon material and the silicon carbide are desirable because they are stable in the heat treatment.

The embodiment of the present invention describes silicon carbide, however, other crystals, for example, materials having hollow core defects such as ZnS and the like can also be used in the above-described method.

(Second Embodiment)

Then, the second embodiment of the present invention will be described. In contrast to the above-described first embodiment, in this second embodiment, micropipe defects 6 present in an SiC substrate 1 are filled with a silicon carbide material 8 before placing the SiC substrate in a heat treatment apparatus, so that it is possible that the closed voids that remain after heat treatment in First Embodiment can be made small more efficiently, as described blow.

For filling the micropipe defects 6 with the SiC material, super critical fluid can be utilized. The super critical fluid is the material in the state which can not be classified as either a gas or a liquid, which is generated by steep increase in gas density at the temperature and the pressure exceeding critical values thereof, respectively. The super critical extraction has been used to remove caffeine from coffee or nicotine from tobacco as the application example.

The super critical fluid is a substance having dissolving ability equivalent to a liquid and high diffusion property and low viscosity near those of a gas. Furthermore, as it lacks the surface tension, a reaction precursor can be easily transported into a fine pore smaller than micron order.

Specifically, the solution used herein can be prepared by dissolving an organosilicon polymer (reaction precursor)

such as polycarboxy silanes (for example, polymethylcarbosilane) into super critical fluid such as carbon dioxide and the like. The solubility in this case can be controlled by the temperature, pressure and entrainers (additives). The above-described super critical fluid maybe, for example, methane, ethane, ethylene, propane, butane, methanol, acetone and the like, in addition to the carbon dioxide. As the entrainer, xylene, toluene and the like can be used.

For example, when super critical carbon dioxide is used, the above-described organosilicon polymer is first penetrated in micropipe defects 6 under temperature and pressure conditions exceeding the critical points (critical temperature: 31. 1° C., critical pressure: $7.4 \times 10^6$ Pa), for example, 35 to 350° C. and $7.6 \times 10^6$ to $6.1 \times 10^7$ Pa. If the penetration treatment is repeated several times, heat treatment for obstructing micropipe defects conducted in the following step can be conducted effectively since coating and filling amount of the SiC material in the micropipe defects 6 can be increased. Further, when the super critical fluid is gasified by lowering the temperature and pressure to normal temperature and normal pressure to be removed, and then the organosilicon is thermally decomposed at the temperature from 600 to 1500° C. in vacuum or in a non-oxidizing ambience such as Ar, $N_2$ and the like. Accordingly, the SiC coating layer can be formed on the inner wall of the micropipe defects 6.

Further, it is also possible that the micropipe defects 6 are filled with a silicon carbide material 8, then, non-mount side of the SiC substrate 1 is coated with a coating material 5 in the same manner as in the above-described first embodiment.

Then, the thus constituted SiC substrate 1 is placed in a heat treating apparatus, and beat treatment is performed therein. In this process, the temperature and pressure conditions of the ambience during the heat treatment by the heat treatment apparatus are the same as those in the above-described first embodiment.

Figure 5:
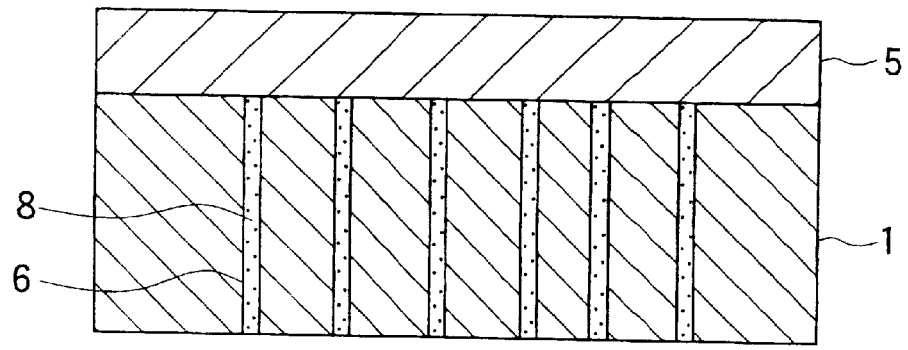
FIG. 5 is a view showing a silicon carbide single crystal having the surface coated with a coating material in a second embodiment of the present invention.
Figure 6:
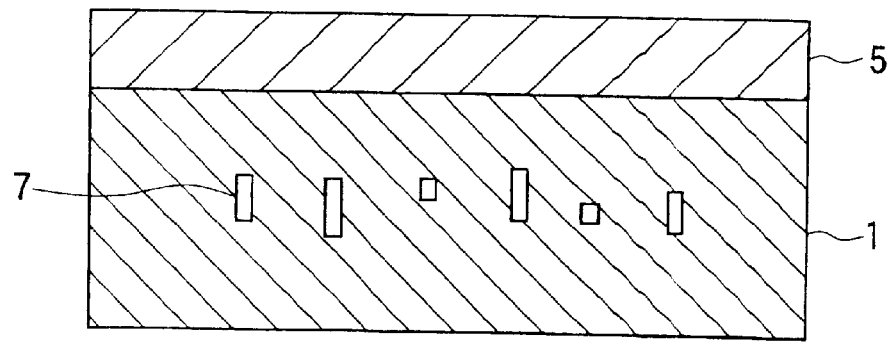
FIG. 6 is a sectional view showing a silicon carbide single crystal after heat treatment in the second embodiment of the present invention.

The SiC substrate 1 before and after the heat treatment in the second embodiment are shown in FIG. 5 and FIG. 6, respectively. FIG. 5 and FIG. 6 correspond to FIG. 2 and FIG. 3 used in the first embodiment. As shown in these figures, in the second embodiment, micropipe defects 6 having openings on the surface of the SiC substrate 1 are closed at least from one surface of the SiC substrate 1 like the first embodiment. In this structure, the closed length of the micropipe defects 6 can be made larger than 75 μm from the surface of the SiC substrate 1.

In FIG. 6, closed voids 7 are remained, however, it is possible that substantially all the micropipe defects 6 can be diminished in length depending on the heat treatment conditions (for example, increase in heat treatment time and the like) like the first embodiment, as the closed pores 7 are gradually closed corresponding to heat treatment time and number of repetition of raising/lowering temperatures. Thus, micropipe defects 6 in the SiC substrate 1 can be closed by the heat treatment that satisfies the above-described temperature and ambience pressure conditions.

Like the first embodiment, the mechanism by which the micropipe defects 6 are closed can be assumed as follows.

In the second embodiment, sublimation from the inner wall of the micropipe defects 6 can be prevented since the micropipe defects 6 are filled with the silicon carbide material 8.

Figure 7:
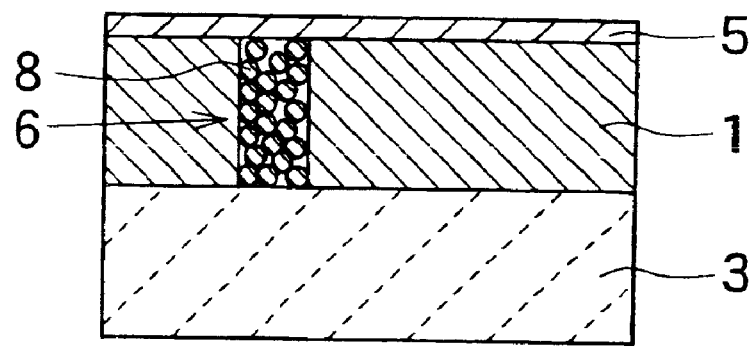
FIG. 7 is a view showing a silicon carbide single crystal coated with a coating material after filling the micropipe defects with the silicon carbide material in the second embodiment of the present invention.

Namely, when the micropipe defects 6 are not filled with the silicon carbide material 8 like the first embodiment, sublimation of vapors occurs also in the inner wall of the micropipe defects 6 as shown in FIG. 4B. In the second embodiment, since the micropipe defects 6 are filled with the silicon carbide material 8 as shown in FIG. 7, the silicon carbide material 8 in the micropipe defects 6 sublimates to inhibit sublimation of the vapors from the inner wall of the micropipe defects 6.

By this mechanism, the micropipe defects 6 can be closed efficiently owing to no sublimation in the inner wall thereof.

Experimental examples in the above-described embodiments will be described hereinafter.

EXAMPLE 1

A 6H-SiC substrate 1 having a thickness of 300 μm containing micropipe defects with a defect density of about 50 $cm^{-2}$ was prepared. A 3C-SiC epitaxial film was formed to have a thickness of about 20 μm as a coating material 5 by the CVD method on the substrate crystal 1.

This substrate 1 was observed using a differential interference optical microscope, a polarizing optical microscope and a scanning electron microscope to find that opening portions of the micropipe defects 6 were completely sealed up with the 3C-SiC epitaxial film. Herein, (0001) just plane was used as the plane of the substrate crystal 1 and the 3C-SiC epitaxial film was formed having the (111) plane as the growing plane.

Then, the substrate crystal 1 was placed in the heat treatment apparatus shown in FIG. 1. In this example, the silicon carbide material 4 was not placed. As a step for closing micropipe defects, heat treatment was performed for 6 hours at the ambience pressure of $6.7 \times 10^4$ Pa, the temperature of the substrate 1 of about 2200° C. and the temperature difference ΔT (ΔT=temperature of silicon carbide source material—temperature of silicon carbide substrate) between the portion where the silicon carbide source material 4 should be placed and the substrate 1 of 0° C.

The resultant substrate crystal through the aforementioned step was cut in parallel to the <0001> axial direction, the cut surface was polished, and observed by a microscope in transmission bright field. As a result, 70% of the micropipe defects existing in the substrate 1 was closed at least from one side of the surface of the substrate.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringerent interference pattern corresponding to the internal stress around micropipe defects was no longer observed. Therefore, micropipe defects once closed can be determined as being stable in view of energy.

EXAMPLE 2

In FIG. 7, A 6H-SiC substrate 1 having a thickness of 300 μm containing micropipe defects with a defect density of about 50 $cm^{-2}$ was prepared, and a 3C-SiC epitaxial film was formed to have a thickness of about 20 μm as a coating material 5 by the CVD method on the substrate crystal 1.

This substrate 1 was observed using a differential interference optical microscope, a polarizing optical microscope and a scanning electron microscope to find that opening portions of the micropipe defects 6 were completely sealed up with the 3C-SiC epitaxial film. Herein, the (0001) just plane was used as the plane of the substrate 1 and the 3C-SiC epitaxial film was formed having the (111) plane as the growing plane.

Then, the substrate crystal 1 was placed in the heat treatment apparatus as shown in FIG. 1, and as the step for closing micropipe defects, heat treatment was performed for 6 hours at the ambience pressure of $1.3 \times 10^2$ Pa, and the substrate temperature of about 2200° C. This heat treatment under the aforementioned conditions was conducted in two ways at the temperature difference $\Delta T$ between the silicon carbide source material 4 and the substrate 1 of 100° C. and 120° C., respectively.

The resultant substrate crystal through the aforementioned step was cut in parallel to the <0001> axial direction, the cut surface was polished, and observed by a microscope in transmission bright field. As a result, in the state where the heat treatment was performed at a temperature difference $\Delta T$ of 100° C., 70% of the micropipe defects existing in the substrate 1 was closed at least from one surface of the substrate. Meanwhile, in the state where the beat treatment was performed at the temperature difference $\Delta T$ of 120° C., 75% of the micropipe defects existing in the substrate 1 was closed at least from one surface of the substrate.

Further, for removing the crystal of the silicon carbide formed during the beat treatment, the substrate 1 was polished in parallel to the (0001) plane, and observed by polarizing optical microscope. As a result, in the portion where the micropipe defects were closed, unique birefringerent interference pattern corresponding to the internal stress around micropipe defects was no longer observed.

EXAMPLE 3

A 6H-SiC substrate 1 having a thickness of 300 μm containing micropipe defects with a defect density of about 50 cm$^{-2}$ was prepared. A 3C-SiC epitaxial film was formed to have a thickness of about 5 μm as a coating material 5 by the CVD method on the substrate 1.

This substrate 1 was observed using a differential interference optical microscope, a polarizing optical microscope and a scanning electron microscope to find that opening portions of the micropipe defects 6 were not completely sealed up with the 3C-SiC epitaxial film. Herein, the (0001) just plane was used as the plane of the substrate crystal 1 and the 3C-SiC epitaxial film was formed having the (111) plane as the growing plane.

Then, the substrate 1 was placed in the heat treatment apparatus as shown in FIG. 1, and as the step for closing micropipe defects, heat treatment was performed for 6 hours at the ambience pressure of $1.3 \times 10^2$ Pa, a substrate temperature of about 2200° C. and a temperature difference $\Delta T$ between the silicon carbide source material 4 and the substrate 1 of 100° C.

The resultant substrate crystal through the aforementioned step was cut in parallel to the <0001> axial direction, the cut surface was polished, and observed by a microscope in transmission bright field. As a result, 50% of the micropipe defects existing in the substrate 1 was closed at least from one side of the surface of the substrate.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringerent interference pattern corresponding to the internal stress around micropipe defects was no longer observed.

EXAMPLE 4

A 6H-SiC substrate 1 having a thickness of 300 μm containing micropipe defects with a defect density of about 50 cm$^{-2}$ was prepared. A 3C-SiC layer was formed to have a thickness of about 20 μm as the coating material 5 on the substrate crystal 1 by repeating a series of steps for applying polymethylcarbosilane dissolved in xylene onto the surface of the substrate 1, drying, then, heating in Ar ambience at 1200° C., and performing thermal decomposition, 4 times in total.

The substrate 1 was observed using a differential interference optical microscope, a polarizing optical microscope and a scanning electron microscope to find that opening portions of the micropipe defects 6 were completely sealed up with the 3C-SiC layer.

Then, the substrate 1 was placed in the heat treatment apparatus shown in FIG. 1, and as the step for closing micropipe defects, heat treatment was performed for 6 hours at the ambience pressure of $1.3 \times 10^2$ Pa, the substrate temperature of about 2200° C. and the temperature difference $\Delta T$ between the silicon carbide source material 4 and the substrate 1 of 100° C.

The resultant substrate crystal through the aforementioned step was cut in parallel to the <0001> axial direction, the cut surface was polished, and observed by a microscope in transmission bright field. As a result, 70% of the micropipe defects existing in the substrate crystal 1 was closed at least from one side of the surface of the substrate crystal.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringerent interference pattern corresponding to the internal stress around micropipe defects was no longer observed.

EXAMPLE 5

A 6H-SiC substrate 1 having a thickness of 300 μm and containing micropipe defects with a defect density of about 40 cm$^{-2}$ was prepared. A 3C-SiC epitaxial film was formed to have a thickness of about 20 μm as a coating material 5 by the CVD method on the substrate 1.

This substrate 1 was observed using a differential interference optical microscope, a polarizing optical microscope and a scanning electron microscope to find that opening portions of the micropipe defects were completely sealed up with the 3C-SiC epitaxial film. Herein, the (0001) just plane was used as the plane of the substrate 1 and the 3C-SiC epitaxial film was formed having the (111) plane as the growing plane.

Then, the substrate crystal 1 was placed in the heat treatment apparatus as shown in FIG. 1, and as the step for closing micropipe defects, heat treatment was performed at the ambience pressure of $1.3 \times 10^2$ Pa. Herein, the heat treatment was performed according to a temperature program for varying the temperature linearly such that the temperature difference $\Delta T$ between the silicon carbide source material 4 and the substrate 1 becomes 20° C. at the beginning of the heat treatment and becomes 65° C. after the elapse of 24 hours. The heat treatment was further performed for 2 hours in which the temperature difference $\Delta T$ was constantly kept at 65° C. The temperature Ts of the substrate 1 was varied from 2285° C. at the beginning of the heat treatment to 2230° C. after the elapse of 24 hours.

The resultant substrate crystal through the aforementioned step was cut in parallel to the <0001> axial direction, the cut surface was polished, and observed by a microscope in transmission bright field. As a result, all the micropipe defects existing in the substrate 1 was closed from both sides of the substrate. Then, 45% of the micropipe defects had a length of 20 μm or less. Further, for removing the crystal of silicon carbide formed during the heat treatment, the substrate 1 was polished in parallel to the (0001) plane, and observed by polarizing optical microscope. As a result, in the portion where the micropipe defects were closed, unique birefringerent interference pattern corresponding to the internal stress around micropipe defects was no longer observed.

EXAMPLE 6

The heat treatment was conducted under the same conditions as those described in Example 2 (for example, condition of the temperature, ambience pressure and the like) except that the thickness of the SiC substrate 1 was changed to 900 μm, the thickness of the 3C-SiC epitaxial film was changed to 2 μm. Openings of micropipe defects 6 weren't sealed up by 3C-SiC epitaxial film completely before the heat treatment.

The resultant substrate crystal through the aforementioned step was cut in parallel to the <0001> axial direction, the cut surface was polished, and observed by a microscope in transmission bright field. As a result, 40% of the micropipe defects existing in the substrate 1 was closed from at least one surface of the substrate 1.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringerent interference pattern corresponding to the internal stress around micropipe defects was no longer observed.

EXAMPLE 7

A heat treatment apparatus was used, in which a silicon carbide source material 4 was placed in the upper portion of a crucible 2 and the SiC substrate 1 was placed in the lower portion thereof.

The substrate 1 (thickness: 300 μm) was placed on a lid at the bottom of the crucible, and a 3C-SiC polycrystal substrate having a thickness of 0.3 mm was placed thereon. A jig which can fix (press) the polycrystal substrate on the substrate was placed in the crucible so as to arrest its movement on the substrate crystal during the process at the reduced pressure or the like. The step for closing micropipe defects was performed by adopting the conditions of the ambience pressure of $6.7 \times 10^4$ Pa, the temperature of 2230° C., the temperature difference ΔT between the silicon carbide source material 4 and the substrate 1 of 20° C. and the heat treatment time of 12 hours.

The resultant substrate through the aforementioned step was cut in parallel to the <0001> axial direction, the cut surface was polished, and observed by a microscope in transmission bright field. As a result, 80% of the micropipe defects existing in the substrate 1 was closed from at least one surface of the substrate 1.

Further, for removing the crystal of silicon carbide formed during the heat treatment, the substrate crystal 1 was polished in parallel to the (0001) plane, and observed by polarizing optical microscope. As a result, in the portion where the micropipe defects were closed, unique birefringerent interference pattern corresponding to the internal stress around micropipe defects was no longer observed.

EXAMPLE 8

As a comparative example to Example 7, the heat treatment was conducted under the same conditions as those described in Example 7 except that a single crystal 6H-SiC substrate having a thickness of 0.3 mm and the same polytype as that of the substrate 1 was placed instead of the 3C-SiC polycrystal substrate.

The resultant substrate crystal through the aforementioned step was cut in parallel to the <0001> axial direction, the cut surface was polished, and observed by a microscope in transmission bright field. As a result, 50% of the micropipe defects existing in the substrate 1 was closed from at least one surface of the substrate 1.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringerent interference pattern corresponding to the internal stress around micropipe defects was no longer observed.

EXAMPLE 9

As a comparative example to Example 5, the heat treatment was conducted under the same conditions as those described in Example 5 except that the thickness of the substrate 1 was changed to 250 μm and a 6H-SiC epitaxial film having a thickness of 10 μm, which was the same polytype as that of the substrate 1, was formed as the coating material 5 of the substrate 1. Openings of micropipe defects 6 were sealed up completely before the heat treatment.

The resultant substrate through the aforementioned step was cut in parallel to the <0001> axial direction, the cut surface was polished, and observed by a microscope in transmission bright field. As a result, all the micropipe defects existing in the substrate 1 was closed from at least one surface of the substrate crystal 1.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringerent interference pattern corresponding to the internal stress around micropipe defects was no longer observed.

EXAMPLE 10

As a comparative example to Example 5, the heat treatment was conducted under the same conditions as those described in Example 5 except that the SiC substrate 1 containing Micropipe defects with a defect density of about 40 $cm^{-2}$ was 4H polytype, and a 10 μm thick 3C-SiC epitaxial film was formed on the (0001) on-axis substrate and (0001)8° off-axis substrate (each of thickness: 300 μm) as the coating material 5 of the substrate 1. Openings of micropipe defects 6 were scaled up completely before the heat treatment.

The resultant substrate obtained through the aforementioned step was cut in parallel to the <0001> axial direction, the cut surface was polished, and observed by a microscope in transmission bright field. As a result, 80% of the micropipe defects existing in the respective substrates 1 was closed from at least one surface of the respective substrates.

Further, for removing the crystal of silicon carbide formed during the heat treatment, the respective substrates 1 were polished in parallel to the (0001) plane, and observed by polarizing optical microscope. As a result, in the portion where the micropipe defects were closed, unique birefringent interference pattern corresponding to the internal stress around micropipe defects was no longer observed.

EXAMPLE 11

As a comparative example to Example 5, the heat treatment was conducted under the same conditions as those described in Example 5 except that the SiC substrate 1 was 6H polytype, and a 10 μm thick tungsten film was formed by a sputter vapor deposition method on the (0001) on-axis substrate (thickness: 200 μm) as the coating material 5 of the substrate crystal 1. Openings of micropipe defects 6 were sealed up completely before the heat treatment.

The resultant substrate through the aforementioned step was cut in parallel to the <0001> axial direction, the cut surface was polished, and observed by a microscope in transmission bright field. As a result, 70% of the micropipe defects existing in the substrate crystal 1 was closed from at least one surface of the substrate 1.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringent interference pattern corresponding to the internal stress around micropipe defects was no longer observed.

EXAMPLE 12

Four 4H-SiC substrates 1 having a thickness of 300 μm and containing micropipe defects with a defect density of about 40 $cm^{-2}$ were prepared, and a 10 μm thick 3C-SiC epitaxial film was formed as the coating material 5 on each of the substrates 1 and thus openings of micropipe defects 6 were completely sealed up. Further, the following surface protecting materials were placed on the coating material 5, respectively; (0) no surface protecting material, (1) tantalum (thickness: 10 μm, formed by a sputter vapor deposition method.), (2) a graphite palte (thickness: 800 μm, fixed by a carbon-based glue.), (3) a 3C-SiC polycrystal substrate (thickness: 500μ, fixed by a carbon-based glue.). The heat treatment was conducted under the same conditions as those described in Example 5.

The resultant substrates through the aforementioned step were cut in parallel to the <0001> axial direction, the cut surfaces were polished, and observed by a microscope in transmission bright field. As a result, 80% in case of (0), 90–100% in case of (1), (2) or (3) of the micropipe defects existing in the substrate 1 was closed from at least one surface of the substrate 1.

EXAMPLE 13

A 6H-SiC substrate 1 having a thickness of 900 μm containing micropipe defects with a defect density of about 40 $cm^{-2}$ was prepared. As the surface of the substrate 1, the (0001) just plane was used. This substrate 1 was not preliminarily coated with the coating film.

This substrate 1 was placed in the heat treatment apparatus as shown in FIG. 1, and as the step for closing micropipe defects, the heat treatment was conducted for 6 hours at the ambience pressure of 1.3'$10^2$ Pa, and the temperature difference ΔT between the silicon carbide source material 4 and the substrate 1 of 100° C. This heat treatment is common to an usual process of the sublimation method.

The resultant substrate through the aforementioned step was cut in parallel to the <0001> axial direction, the cut surface was polished, and observed by a microscope in transmission bright field. As a result, 30% of the micropipe defects existing in the substrate 1 was closed at least from one surface of the substrate crystal 1.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringent interference pattern corresponding to the internal stress around micropipe defects was no longer observed.

The surface of the substrate 1 was observed carefully to find that a layer of a color different from that of the mother crystal constituting the substrate 1 had been formed. This layer was identified as being 3C-SiC by a Raman spectroscopy.

That is, it is believed that different polytype (3C-SiC) was formed on the surface of the substrate 1 at the initial stage of the growth in the sublimation processing, and the micropipe defects were closed by performing the heat treatment continuously thereafter.

On the other hand, even in the regions where the 3C-SiC layer was not formed in the layer grown by the sublimation method, it was observed that micropipe defects were closed from the mount side of the substrate 1. This shows that the heat treatment of micropipe defects in saturated condition of SiC vapors is effective for closing the micropipe defects.

Thus, even in the state where openings of micropipe defects 6 are not sealed up, openings of micropipe defects can be closed by conducting the heat treatment using the sublimation processing in which the micropipe defects are saturated with SiC vapors.

EXAMPLE 14

A 6H-SiC substrate 1 having a thickness of 300 μm containing micropipe defects with a defect density of about 50 $cm^{-2}$ was prepared. A 3C-SiC epitaxial film was formed to have a thickness of about 4 μm by the CVD method on the surface of this substrate 1. This substrate 1 was observed using a differential interference optical microscope, a polarizing optical microscope and a scanning electron microscope to find that the micropipe defects were completely sealed up with the 3C-SiC epitaxial film. Herein, the (0001) just plane was used as the plane of the substrate 1 and the 3C-SiC epitaxial film was formed having the (111) plane as the growing plane.

Then, the substrate 1 was placed in the heat treatment apparatus as shown in FIG. 1, and as the step for closing micropipe defects, the heat treatment was conducted for 12 hours at the ambience pressure of 6.7×$10^4$ Pa. Herein, the heat treatment was performed under conditions of the temperature difference ΔT between the silicon carbide source material 4 and the substrate 1 at the initial stage of the heat treatment of 20° C. and the constant temperature Ts of the substrate 1 of 2230° C.

The resultant substrate crystal through the aforementioned step was cut in parallel to the <0001> axial direction, the cut surface was polished, and observed by a microscope in transmission bright field. As a result, all the micropipe defects existing in the substrate 1 was closed at least from one surface of the substrate 1.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringent interference pattern corresponding to the internal stress around micropipe defects was no longer observed.

EXAMPLE 15

A 6H-SiC substrate 1 having a thickness of 500 μm containing micropipe defects with a defect density of about 50 cm$^{-2}$ was prepared. A 3C-SiC epitaxial film was formed to have a thickness of about 10 μm as the coating material 5 by the CVD method on this substrate 1. This substrate 1 was observed using a differential interference optical microscope, a polarizing optical microscope and a scanning electron microscope to find that the opening portions of the micropipe defects were completely sealed up with the 3C-SiC epitaxial film. Herein, the (0001) just plane was used as the plane of the substrate crystal 1 and the 3C-SiC epitaxial film was formed having the (111) plane as the growing plane.

Then, the substrate 1 was placed in the heat treatment apparatus as shown in FIG. 1, and as the step for closing micropipe defects, the heat treatment was conducted for 6 hours at the ambience pressure of 2.0×10$^8$ Pa. Herein, the heat treatment was performed under conditions of the temperature difference ΔT between the silicon carbide source material 4 and the substrate 1 of 0° C. and a constant temperature Ts of the substrate 1 of 2200° C.

The resultant substrate crystal through the aforementioned step was cut cut in parallel to the <0001> axial direction, the cut surface was polished, and observed by a microscope in transmission bright field. As a result, all the micropipe defects existing in the substrate 1 was closed at least from one surface of the substrate crystal 1.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringent interference pattern corresponding to the internal stress around micropipe defects was no longer observed.

Thus, even when the heat treatment was conducted at the substantially high pressure, micropipe defects can be closed.

EXAMPLE 16

A 6H-SiC substrate 1 having a thickness of 300 μm containing micropipe defects with a defect density of about 40 cm$^2$ was prepared. A 3C-SiC epitaxial films were formed by the CVD method on both surfaces of this substrate 1 such that the thickness on the mount side was about 12 μm and the thickness on the non-mount side was about 4 μm. This substrate 1 was observed using a differential interference optical microscope, a polarizing optical microscope and a scanning electron microscope to find that the opening portions of the micropipe defects were completely sealed up with the 3C-SiC epitaxial film. Herein, the (0001) just plane was used as the plane of the substrate 1 and the 3C-SiC epitaxial films on both sides were formed having the (111) plane as the growing plane.

Then, the substrate 1 was placed in the heat treatment apparatus as shown in FIG. 1, and as the step for closing micropipe defects, the heat treatment was conducted at the ambience pressure of 1.3×10$^2$ Pa. Herein, the heat treatment was performed according to a temperature program for varying the temperature linearly such that the temperature difference A T between the silicon carbide source material 4 and the substrate 1 is 20° C. at the initial stage of the heat treatment and is 42° C. after the elapse of 24 hours. The temperature Ts of the substrate 1 was varied so as to become 2230° C. at the initial stage of the heat treatment and 2208° C. after the elapse of 24 hours.

The resultant substrate through the aforementioned step was cut in parallel to the <0001> axial direction, the cut surface was polished, and observed by a microscope in transmission bright field. As a result, all the micropipe defects existing in the substrate 1 was closed at least from one surface of the substrate crystal 1. Then 41% of the micropipe defects was closed from both surfaces of the substrate 1.

Further, for removing the crystal of silicon carbide formed during the heat treatment, the substrate crystal 1 was polished in parallel to the (0001) plane, and observed by polarizing optical microscope. As a result, in the port ion where the micropipe defects were closed, unique birefringent interference pattern corresponding to the internal stress around micropipe defects was no longer observed.

EXAMPLE 17

A 6H-SiC substrate 1 having a thickness of 700 μm containing micropipe defects with a defect density of about 50 cm$^{-2}$ was prepared. An amorphous SiC layer was formed to have a thickness of about 5 μm by irradiating the surface of the substrate 1 with a high speed Ar ion beam. This substrate 1 was observed after this surface modification treatment using a differential interference optical microscope, a polarizing optical microscope and a scanning electron microscope to find that the micropipe defects were not sealed up with the amorphous SiC layer. Herein, the (0001) just plane was used as the plane of the substrate 1.

Then, the substrate 1 was placed in the heat treatment apparatus as shown in FIG. 1, and as the step for closing micropipe defects, the heat treatment was conducted at the ambience pressure of 1.3×10$^2$ Pa. Herein, the heat treatment was conducted for 6 hours under conditions of the temperature difference ΔT between the silicon carbide source material 4 and the substrate 1 of 60° C. and the Ts of 2230° C.

The resultant substrate crystal through the aforementioned step was cut in parallel to the <0001> axial direction, the cut surface was polished, and observed by a microscope in transmission bright field. As a result, 70% of the micropipe defects existing in the substrate 1 was closed at least from one surface of the substrate 1.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringent interference pattern corresponding to the internal stress around micropipe defects was no longer observed.

In this example, the amorphous SiC layer was formed by ion implantation, however, an amorphous SiC may also be laminated and deposited on the substrate 1.

EXAMPLE 18

A 6H-SiC substrate 1 having a thickness of 700 μm, a nitrogen atom concentration of 8.8×10$^{17}$ atoms/cm$^3$, and micropipe defects with a defect density of about 40 cm$^{-2}$ was prepared. As the surface of the substrate 1, the (0001) just plane was used.

Then, the substrate 1 was placed in the heat treatment apparatus as shown in FIG. 1, and as the step for closing micropipe defects, a nitrogen gas was introduced in inert gas and the heat treatment was conducted for 6 hours at the ambience pressure of 1.3×10$^2$ Pa. Herein, the heat treatment was performed under conditions of the temperature difference ΔT between the silicon carbide source material 4 and the substrate 1 of 65° C. and the Ts of 2230° C.

The resultant substrate through the aforementioned step was cut in parallel to the <0001> axial direction, the cut surface was polished, and observed by a microscope in transmission bright field. As a result, 80% of the micropipe defects existing in the substrate 1 was closed at least from one surface of the substrate 1.

The nitrogen concentration in the crystal regions formed on the substrate 1 was measured to be $1.3 \times 10^{18}$ atoms/cm$^3$. Therefore, during the growth in a sublimation processing, even when the same polytype layer doped with impurity atoms other than SiC constituent atoms is formed on the substrate surface, micropipe defects can be closed by continuously performing the heat treatment thereafter.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringent interference pattern corresponding to the internal stress around micropipe defects was no longer observed.

EXAMPLE 19

A 6H-SiC substrate 1 having a thickness of 700 μm containing micropipe defects with a defect density of about 40 cm$^{-2}$ was prepared. The surface of this substrate 1 was subjected to etching in a molten alkali (KOH) at 500° C. for 10 minutes. Herein, the (0001) just plane was used as the surface of the substrate 1.

On the etched surface of the substrate 1, the 3C-SiC epitaxial film was formed by the CVD method. The thickness of the 3C-SiC epitaxial film was about 20 μm at the portion where etching pit was not formed, and the (111) plane constituted the growing plane. Openings of the micropipe defects 6 were completely sealed up before the heat treatment.

Then, the substrate 1 was placed in the heat treatment apparatus as shown in FIG. 1, and as the step for closing micropipe defects, the heat treatment was performed at the ambience pressure of $1.3 \times 10^2$ Pa. Herein, the heat treatment was performed according to a temperature program for varying the temperature such that the temperature difference ΔT between the silicon carbide source material 4 and the substrate 1 becomes 20° C. at the initial stage of the heat treatment and 65° C. after the elapse of 24 hours. The heat treatment was further performed for 2 hours in which the temperature difference ΔT was kept constant at 65° C. The temperature Ts of the substrate 1 was varied so as to become 2285° C. at the initial stage of the heat treatment and become 2225° C. after the elapse of 24 hours.

The resultant substrate through the aforementioned step was cut in parallel to the <0001> axial direction, the cut surface was polished, and observed by a microscope in transmission bright field. As a result, all the micropipe defects existing in the substrate 1 was closed from both surfaces of the substrate 1. Then 50% or more of the micropipe defects had the length of 20 μm or less.

Furthermore, for removing the crystal of silicon carbide formed during the heat treatment, the substrate 1 was polished in parallel to the (0001) plane, and observed by polarizing optical microscope. As a result, in the portion where the micropipe defects were closed, unique birefringent interference pattern corresponding to the internal stress around micropipe defects was no longer observed.

Thus, the micropipe defects can also be closed by etching the surface of the substrate 1, forming a 3C-SiC epitaxial film, and conducting the heat treatment.

EXAMPLE 20

A 6H-SiC substrate 1 having a thickness of 300 μm containing micropipe defects with a defect density of about 30 cm$^{-2}$ was prepared. Graphite plates were pasted using a carbon-based glue on both sides of the substrate 1 to sandwich the substrate 1 therebetween. Herein, as the surface of the substrate 1, the (0001) just plane was used.

Then, the substrate 1 was placed in the heat treatment apparatus as shown in FIG. 1, and as the step for closing micropipe defects, the heat treatment was conducted for 24 hours at the ambience pressure of $1.3 \times 10^2$ Pa. Herein, the heat treatment was conducted under conditions of the temperature difference ΔT between the silicon carbide source material 4 and the substrate 1 of 65° C. and the temperature Ts of the substrate 1 of 2230° C.

The resultant substrate through the aforementioned step was cut in parallel to the <0001> axial direction, the cut surface was polished, and observed by a microscope in transmission bright field. As a result, 90% of the micropipe defects existing in the substrate 1 was closed at least from one surface of the substrate 1. Then 50% of the micropipe defects was closed from both surfaces of the substrate 1.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringent interference pattern corresponding to the internal stress around micropipe defects was no longer observed.

Thus, micropipe defects can also be closed when graphite plates were placed on both sides of the substrate 1 and the heat treatment was conducted.

EXAMPLE 21

A heat treatment apparatus was used, in which the silicon carbide source material 4 was placed in the upper portion of the crucible 2 and the SiC substrate 1 was placed in the lower portion (lid) thereof. In the process described in Example 20, the substrate 1 (thickness: 300 μm) same as Example 20 was pasted to the lid using a carbon-based glue, polymethylcarboxysilane dissolved in xylene was applied on the non-mount surface of the substrate crystal, and the graphite plate was pasted onto it. The heat treatment was conducted under the same treating conditions as those described in Example 20.

The resultant substrate through the aforementioned step was cut in parallel to the <0001> axial direction, the cut surface was polished, and observed by a microscope in transmission bright field. As a result, all the micropipe defects existing in the substrate 1 was closed from at least one side of the growing surface. Then 65% of the micropipe defects was closed from both surfaces of the substrate 1.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringent interference pattern corresponding to the internal stress around micropipe defects was no longer observed.

EXAMPLE 22

In the process described in Example 20, the substrate 1 (thickness: 300 μm) same as Example 18 was pasted to the lid 3 using the carbon-based glue, an SiC powder or SiC substrate was placed on the non-mount surface of the substrate 1, and a graphite plate was placed thereon. A (press) jig capable of fixing the SiC powder or SiC substrate on the substrate 1 was placed in the crucible so as to arrest the motion thereof during the process at the reduced pressure or the like, and the heat treatment was performed under the same treating conditions as described in Example 20.

The resultant substrate through the aforementioned step was cut in parallel to the <0001> axial direction, the cut surface was polished, and observed by a microscope in transmission bright field. As a result, 60% of the micropipe defects existing in the substrate 1 was closed from both surfaces of the substrate 1.

EXAMPLE 23

A heat treatment apparatus was used, in which the silicon carbide source material 4 was placed in the upper portion of the crucible 2 and the substrate 1 was placed in the lower portion (lid) thereof. First, a 3C-SiC polycrystal substrate having a thickness of 0.3 mm was placed on the lid, 4H-SiC substrate 1 (thickness: 300 μm) containing micropipe defects with a defect density of about 30 cm$^{-2}$ was placed thereon, and another 3C-SiC polycrystal substrate having a thickness of 0.3 mm was placed thereon. In this way, 5 substrates and 6 3C-SiC polycrystal substrates were alternately laminated. A (press) jig capable of fixing the respective substrates was placed in the crucible so as to arrest the movement thereof during the process at the reduced pressure. The step for closing micropipe defects was performed under the conditions of the ambience pressure of $6.7 \times 10^4$ Pa, the temperature of 2230° C., the temperature difference ΔT between the silicon carbide source material 4 and the substrate 1 of 20° C. and the heat treatment period of 12 hours.

The resultant substrate through the aforementioned step was cut in parallel to the <0001> axial direction, the cut surface was polished, and observed by a microscope in transmission bright field. As a result, 50 to 80% of the micropipe defects existing in the substrate 1 were closed from at least one surface of the respective substrates.

Further, for removing the crystal of silicon carbide formed during the heat treatment, the substrate 1 was polished in parallel to the (0001) plane, and observed by polarizing optical microscope. As a result, in the portion where the micropipe defects were closed, unique birefringent interference pattern corresponding to the internal stress around micropipe defects was no longer observed.

EXAMPLE 24

First, two 300 μm thick 4H-SiC substrates 1 having micropipe defects with a defect density of about 30 cm$^{-2}$ were prepared. In the presence of the above-described substrates 1, the xylene solution containing 15 wt % of polycarbosilane was dissolved in super critical carbon dioxide at 170° C. The retention pressure and retention time were set to $2.5 \times 10^7$ Pa and 2 hours, respectively. Then, the temperature and pressure were returned to room temperature and atmospheric pressure and the super critical carbon dioxide was vaporized for removal. Then, it was heated in Ar ambience at 1200° C. for conducting thermal decomposition. This process was repeated three times to fill the micropipe defects with the silicon carbide material.

Then one of the substrates 1 was coated with a 3C-SiC epitaxial film having a thickness of about 20 μm, while the other was free from the coating material. The two substrates 1 were then subjected to heat treatment under the same treating conditions (pressure of ambience: $1.3 \times 10^2$ Pa, temperature of the substrate 1: 2200° C., temperature difference ΔT between the silicon carbide source material 4 and the substrate 1: 100° C., heat treatment period: 24 hours).

The resultant substrates through the aforementioned step were cut in parallel to the <0001> axial direction, the cut surface was polished, and observed by a microscope in transmission bright field. As a result, all the micropipe defects existing in the substrate was closed from at least one surface of the substrates. And, of the micropipe defects, 80% (coated substrate), 50% (non-coated substrate) were closed from both sides of the respective substrates.

EXAMPLE 25

First, a 300 μm thick 6H-SiC substrate 1 having micropipe defects with a defect density of about 30 cm$^{-2}$ was prepared. The surface of the above-described substrate 1 was coated with a 3C-SiC epitaxial film having a thickness of about 20 μm and subjected to the heat treatment. The heat treatment was performed at the ambience pressure of $1.3 \times 10^2$ Pa for 6 hours in total. The temperature of the silicon carbide source material 4 was kept at 2300° C., and the temperature of the substrate 1 was raised to 2280° C., then lowered to 2230° C., raised to 2280° C. again, and lowered to 2230° C. Such raising and lowering of the temperature (heat cycle treatment) was repeated five times. The temperature increase rate was about 5.3° C./minute and the temperature decrease rate was about 1.3° C./minute in this cycle. After the heat cycle treatment, the temperature of the substrate 1 was lowered with the elapse of time.

The resultant substrate through the aforementioned step was cut in parallel to the <0001> axial direction, the cut surface was polished, and observed by a microscope in transmission bright field. As a result, all the micropipe defects existing in the substrate was closed from at least one surface of the substrate.

EXAMPLE 26

A 500 μm thick 6H-SiC substrate 1 containing micropipe defects with a defect density of about 40 cm$^{-2}$ was prepared. Both surfaces. of the substrate 1 were coated with 3C-SiC epitaxial films by the CVD method such that the thickness thereof on the mount side was about 20 μm and the thickness on the non-mount side was about 10 μm. This substrate 1 was observed using a differential interference optical microscope, a polarizing optical microscope and a scanning electron microscope to find that the opening portions of the micropipe defects were completely sealed up with the 3C-SiC epitaxial film. Herein, the (0001) just plane was used as the plane of the substrate 1 and the 3C-SiC epitaxial film was formed having the (111) plane as the growing plane.

Then, the substrate 1 was placed in the heat treatment apparatus as shown in FIG. 1, and as the step for closing micropipe defects, heat treatment was performed for 12 hours at the ambience pressure of $6.7 \times 10^4$ Pa. Herein, the heat treatment was performed at the temperature difference ΔT between the silicon carbide source material 4 and the substrate 1 of –10° C., and the constant temperature Ts of the substrate 1 of 2230° C. Namely, the heat treatment was conducted such that the temperature of the silicon carbide source material 4 was lower than that of the substrate 1.

The resultant substrate through the aforementioned step was cut in parallel to the <0001> axial direction, the cut surface was polished, and observed by a microscope in transmission bright field. As a result, all the micropipe defects existing in the substrate 1 was closed at least from one surface of the substrate 1.

Further, the substrate 1 was polished in parallel to the (0001) plane, and observed by polarizing optical microscope. As a result, in the portion where the micropipe defects were closed, unique birefringent interference pattern corresponding to the internal stress around micropipe defects was no longer observed.

In the above-described Examples 1 to 25, re-crystallization of the substrate 1 and crevasse-like defects due to the re-crystallization occurred between the mount side (graphite plate in Example 19) and the substrate 1. In the present example, however, it was found that the occurrence of these phenomena can be prevented.

In the present example, the temperature relation between the substrate 1 and the silicon carbide source material 4 is inverted to conduct the heat treatment, unlike conventional sublimation processing in which the heat treatment is conducted at the temperature gradient that causes the temperature of the substrate 1 to be lower than that of the silicon carbide source material 4. Therefore, it can be concluded that the present example is effective for preventing re-crystallization of the substrate 1 or crevasse-like defects due to the re-crystallization.

EXAMPLE 27

The SiC substrates 1 obtained in Examples 1 to 26 in which micropipe defects were closed were cut out in parallel to the (0001) plane and polished, used again as seed crystals for the sublimation growth, and growth of single crystals with high quality was performed.

As a result, single crystals having no micropipe defect grew, and there observed no phenomenon in which the closed micropipe defects opened again. Furthermore, no micropipe defect was newly induced in the growing layers.

Thus, the single crystal having no micropipe defect can also be produced by using any one of the substrates 1 obtained in Examples 1 to 26 as the seed crystal in which micropipe defects were closed, and allowing the silicon carbide single crystal to grow thereon.

The thus produced silicon carbide single crystal can be cut out and polished to provide an SiC substrate which can be used for the device fabrication.

Examples 1 to 26 show that the micropipe defects can be effectively closed, and for reference, comparative examples will be described below.

Comparative Example 1

A 6H-SiC substrate 1 having a thickness of 900 μm containing micropipe defects with a defect density of about 40 cm$^{-2}$ was prepared, and no coating was formed thereon. Herein, the (0001) just plane was adopted as the plane of the substrate 1.

Then, the substrate 1 was placed in the heat treatment apparatus as shown in FIG. 1. As the step for closing micropipe defects, heat treatment was performed for 6 hours at the ambience pressure of $1.3 \times 10^2$ Pa, the temperature of the substrate 1 of about 2200° C., and the temperature difference $\Delta T$ between the silicon carbide source material 4 and the substrate 1 of 65° C.

The resultant substrate through the aforementioned step was cut in parallel to the <0001> axial direction, the cut surface was polished, and observed by a microscope in transmission bright field. As a result, only a few % of the micropipe defects existing in the substrate 1 was closed at least from one surface of the substrate 1.

Comparative Example 2

A 6H-SiC substrate 1 having a thickness of 900 μm containing micropipe defects with a defect density of about 40 cm$^{-2}$ was prepared, and no coating was formed thereon. Herein, the (0001) just plane was adopted as the plane of the substrate 1.

Then, the substrate 1 was placed in the heat treatment apparatus shown in FIG. 1. In the present comparative example, the silicon carbide source material 4 was not placed. As the step for closing micropipe defects, heat treatment was performed for 6 hours at the ambience pressure of $6.7 \times 10^4$ Pa, the temperature of the substrate 1 of about 2600° C. and the temperature difference $\Delta T$ between the portion where the silicon carbide source material 4 should be placed and the substrate 1 of 0° C.

The resultant substrate through the aforementioned step was cut in parallel to the <0001> axial direction, the cut surface was polished, and observed by a microscope in transmission bright field. As a result, no closing of the micropipe defects existing in the substrate 1 was recognized. It was recognized that the surface of the substrate 1 was carbonized and the micropipe defects were opened. This indicates that the micropipe defects cannot be closed in the state where the inside of the micropipe defects is not saturated.

Comparative Example 3

Unlike the aforementioned Example 3, the thickness of the SiC substrate 1 was 300 μm and a non-oriented 3C-SiC polycrystal film was formed to have a thickness of 5 μm as the coating material 5 of the substrate 1.

This substrate 1 was observed using a differential interference optical microscope, a polarizing optical microscope and a scanning electron microscope to find that SiC grains grew like islands, the grain boundary and the crevasse-like defects were observed at opening port ions of the micropipe defects. Therefore, it was estimated that the opening portions of the micropipe defects were not completely sealed up.

This substrate 1 was subjected to the heat treatment under the same treatment conditions as in Example 3.

The resultant substrate through the aforementioned step was cut in parallel to the <0001> axial direction, the cut surface was polished, and observed by a microscope in transmission bright field. As a result, only 30% of the micropipe defects existing in the substrate was closed from at least one surface of the substrate 1. This indicates that the heat treatment of the substrate in which opening portions of micropipe defects were completely sealed up with the coating material is effective for closing the micropipe defects.

Moreover, compared with Example 3, it is understood that there is high probability that micropipe defects are closed in case the orientation of the coating material on the single crystal (or polycrystal) is coincident with the crystal axis of the SiC substrate.

Evaluation indices for the closing phenomena are introduced to quantify the above-mentioned results. The indices are defined as the following.

Closing rate=(total number of the closed micropipe defects)/(total number of micropipe defects)×100(%)

Average closing length=(summation of the closed length)/(total number of micropipe defects)(μm)

Closing rate=(the average closing length)/(thickness of SiC substrate)×100(%)

The results of evaluation are showed in FIG. 11 and FIG. 12

What is claimed is:
1. A manufacturing method for a silicon carbide single crystal comprising the steps of:
preparing a silicon carbide single crystal having micropipe defects;

coating at least a portion of a surface of said silicon carbide single crystal with a coating material; and closing at least partially said micropipe defects existing in said silicon carbide single crystal within said silicon carbide single crystal to form at least partially closed voids by performing heat treatment.

2. The manufacturing method for a silicon carbide single crystal according to claim 1, wherein said coating step comprises a step of forming a silicon carbide on at least a portion of the surface of said silicon carbide single crystal.

3. The manufacturing method for a silicon carbide single crystal according to claim 1, wherein said coating step comprises a step of placing a silicon carbide substrate or a silicon carbide powder on one surface or both surfaces of said silicon carbide single crystal.

4. The manufacturing method for a silicon carbide single crystal according to claim 1, wherein said coating step comprises a step of forming a silicon carbide having the same/different polytype as that of said silicon carbide single crystal on at least a portion of a surface of said silicon carbide single crystal.

5. The manufacturing method for a silicon carbide single crystal according to claim 1, wherein said coating step comprises a step of forming a silicon carbide epitaxial film which is oriented in the same direction with a crystal axis of said silicon carbide single crystal and has the same/different polytype as that of said silicon carbide single crystal on at least a portion of a surface of said silicon carbide single crystal.

6. The manufacturing method for a silicon carbide single crystal according to claim 1, wherein said coating step comprises a step of forming a 3C polytype silicon carbide on at least a portion of a surface of said silicon carbide single crystal.

7. The manufacturing method for a silicon carbide single crystal according to claim 1, wherein said coating step comprises a step of forming a 3C polytype silicon carbide oriented in the same direction with a crystal axis of said silicon carbide single crystal on at least a portion of a surface of said silicon carbide single crystal.

8. The manufacturing method for a silicon carbide single crystal according to claim 1, wherein said coating step comprises a step of forming anamorphous silicon carbideon at least a portion of a surface of said silicon carbide single crystal.

9. The manufacturing method for a silicon carbide single crystal according to claim 1, wherein said coating step comprises a step of forming a substance exhibiting a high melting point on at least a portion of a surface of said silicon carbide single crystal.

10. The manufacturing method for a silicon carbide single crystal according to claim 1, wherein said coating step comprises a step of placing a carbon material on at least a portion of a surface of said silicon carbide single crystal.

11. The manufacturing method for a silicon carbide single crystal according to claim 1, wherein said coating step comprises a step of placing a carbon material via a material containing silicon on at least a portion of a surface of said silicon carbide single crystal.

12. The manufacturing method for a silicon carbide single crystal according to claim 1, further comprising a step of etching the surface of said silicon carbide single crystal which is succeeded by said coating step.

13. The manufacturing method for a silicon carbide single crystal according to claim 1, wherein said coating step comprises a step of completely sealing up opening portions of said micropipe defects in said silicon carbide single crystal with said coating material.

14. The manufacturing method for a silicon carbide single crystal according to claim 1, wherein said preparing step is a step for preparing a plurality of silicon carbide single crystals having micropipe defects;

further comprising a step of laminating said plurality of silicon carbide single crystals; and wherein said heat treatment is performed concurrently to said plurality of silicon carbide single crystals laminated in said laminating step.

15. The manufacturing method for a silicon carbide single crystal according to claim 1, wherein said preparing step is a step for preparing a plurality of silicon carbide single crystals having micropipe defects, further comprising a step of laminating said plurality of silicon carbide single crystals via said coating material, and wherein said heat treatment is performed concurrently to said plurality of silicon carbide single crystals laminated in said laminating step.

16. A manufacturing method for a silicon carbide single crystal comprising the steps of:

preparing a silicon carbide single crystal having micropipe defects;

coating at least a portion of a surface of said silicon carbide single crystal with a coating material; and closing said micropipe defects existing in said silicon carbide single crystal within said silicon carbide single crystal to form at least partially closed voids by performing heat treatment and saturating an inside of said micropipe defects with silicon carbide vapors.

17. A manufacturing method for a silicon carbide single crystal comprising the steps of:

preparing a silicon carbide single crystal having micropipe defects;

coating at least a portion of a surface of said silicon carbide single crystal with a coating material;

providing on said coating material a surface protecting material which protects a surface of said coating material; and closing at least partially said micropipe defects existing in said silicon carbide single crystal within said silicon carbide single crystal to form at least partially closed voids by performing heat treatment.

18. The manufacturing method for a silicon carbide single crystal according to claim 17, further comprising a step of fixing said silicon carbide single crystal on a seat to be installed in a crucible in which a silicon carbide source material is accommodated before said heat treatment.

19. The manufacturing method for a silicon carbide single crystal according to claim 17 or 18, said surface protecting material is made of a substance exhibiting a high melting point.

20. The manufacturing method for a silicon carbide single crystal according to claim 17 or 18, said surface protecting material is made of a carbon material, a silicon carbide substrate or a silicon carbide powder.

21. A manufacturing method for a silicon carbide single crystal comprising the steps of:

preparing a silicon carbide single crystal having micropipe defects; and closing said micropipe defects existing in said silicon carbide single crystal within said silicon carbide single crystal to form at least partially closed voids by performing heat treatment and saturating an inside of said micropipe defects with silicon carbide vapors.

22. A manufacturing method for a silicon carbide single crystal comprising the steps of:
preparing a silicon carbide single crystal having micropipe defects;
filling an inside of said micropipe defects with a silicon carbide material; and
closing said micropipe defects existing in said silicon carbide single crystal within said silicon carbide single crystal to form at least partially closed voids by performing heat treatment and saturating an inside of said micropipe defects with silicon carbide vapors.

23. A manufacturing method for a silicon carbide single crystal comprising the steps of:
preparing a silicon carbide single crystal having micropipe defects;
filling an inside of said micropipe defects with a silicon carbide material;
coating at least a portion of said silicon carbide single crystal with a coating material; and
closing at least partially said micropipe defects existing in said silicon carbide single crystal within said silicon carbide single crystal to form at least partially closed voids by performing heat treatment.

24. A manufacturing method for a silicon carbide single crystal comprising the steps of:
preparing a silicon carbide single crystal having micropipe defects;
closing said micropipe defects existing in said silicon carbide single crystal within said silicon carbide single crystal to form at least partially closed voids by performing heat treatment and saturating an inside of said micropipe defects with silicon carbide vapors;
wherein said heat treatment step comprises a step of repeating a step for raising a temperature of said silicon carbide single crystal and a step for lowering the temperature of said silicon carbide single crystal from said raised temperature.

25. A manufacturing method for a silicon carbide single crystal comprising the steps of:
preparing a silicon carbide single crystal having micropipe defects;
coating at least a portion of a surface of said silicon carbide single crystal with a coating material;
fixing said silicon carbide single crystal on a seat to be installed in a crucible in which a silicon carbide source material is accommodated; and
closing at least partially said micropipe defects existing in said silicon carbide single crystal within said silicon carbide single crystal to form at least partially closed voids by performing heat treatment.

26. The manufacturing method for a silicon carbide single crystal according to claim 25, wherein said heating treatment is performed by keeping a temperature difference between said silicon carbide single crystal and said silicon carbide source material in the range from −200° C. to 200° C.

27. A manufacturing method for a silicon carbide single crystal comprising the steps of:
preparing a silicon carbide single crystal having micropipe defects;
fixing said silicon carbide single crystal on a seat to be installed in a crucible in which a silicon carbide source material is accommodated; and
sublimating said silicon carbide source material by performing heat treatment and supplying said sublimated silicon carbide source material to form a coating material made of a silicon carbide on at least a portion of a surface of said silicon carbide single crystal and further continuing the heat treatment to close at least partially said micropipe defects existing in said silicon carbide single crystal within said silicon carbide single crystal to form at least partially closed voids.

28. The manufacturing method for a silicon carbide single crystal according to claim 27, wherein said heating treatment is performed by introducing a nitrogen gas into an inert gas ambience of a vessel.

29. A manufacturing method for a silicon carbide single crystal, wherein a new silicon carbide single crystal is allowed to grow using a seed crystal as the silicon carbide single crystal having micropipe defects closed, which is formed by the manufacturing method for a silicon carbide single crystal according to any one of claim 1, 16, 21, 22, 23, 24, 25 or 27.

30. A silicon carbide single crystal having closed voids in which at least a portion of micropipe defects are closed, which is formed by the manufacturing method for a silicon carbide single crystal according to any one of claim 1, 16, 22, 23, 24, 25, 27 or 29.

31. The silicon carbide single crystal according to claim 30, wherein a length of a portion closed in said closed voids exceeds 75 $\mu$m.

* * * * *

UNITED STATES PATENT AND TRADEMARK OFFICE
CERTIFICATE OF CORRECTION

PATENT NO. : 6,214,108 B1  
DATED : April 10, 2001  
INVENTOR(S) : Atsuto Okamoto et al.

It is certified that error appears in the above-identified patent and that said Letters Patent is hereby corrected as shown below:

<u>Title page,</u>
Item [30], Foreign Application Priority Data, should read as follows:

-- [30]        Foreign Application Priority Data

| | | |
|---|---|---|
| May 29, 1998 | (JP) | 10-149912 |
| Jul. 17, 1998 | (JP) | 10-203696 |
| Jul. 17, 1998 | (JP) | 10-203697 |
| Jul. 21, 1998 | (JP) | 10-221099 -- |

Signed and Sealed this

Twentieth Day of November, 2001

Attest:

NICHOLAS P. GODICI  
*Attesting Officer*   *Acting Director of the United States Patent and Trademark Office*